United States Patent
Iwasaki et al.

(10) Patent No.: US 8,564,904 B2
(45) Date of Patent: Oct. 22, 2013

(54) MAGNETIC HEAD WITH STACKED MAGNETIC LAYERS, MAGNETIC HEAD ASSEMBLY, AND MAGNETIC RECORDING/REPRODUCING APPARATUS

(75) Inventors: Hitoshi Iwasaki, Tokyo (JP); Masayuki Takagishi, Tokyo (JP); Kenichiro Yamada, Tokyo (JP); Susumu Hashimoto, Tokyo (JP); Yusuke Tomoda, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 1 day.

(21) Appl. No.: 13/239,496

(22) Filed: Sep. 22, 2011

(65) Prior Publication Data
US 2012/0243127 A1  Sep. 27, 2012

(30) Foreign Application Priority Data

Mar. 23, 2011  (JP) .................. 2011-064252

(51) Int. Cl.
*G11B 5/127* (2006.01)
(52) U.S. Cl.
USPC ........................................ 360/125.3
(58) Field of Classification Search
USPC ...................... 360/125.3, 128, 317
See application file for complete search history.

(56) References Cited

U.S. PATENT DOCUMENTS

| | | | |
|---|---|---|---|
| 6,967,863 B2* | 11/2005 | Huai | 365/158 |
| 7,616,412 B2 | 11/2009 | Zhu et al. | |
| 7,929,258 B2* | 4/2011 | Xue et al. | 360/324.12 |
| 7,957,098 B2 | 6/2011 | Yamada et al. | |
| 8,139,322 B2* | 3/2012 | Yamada et al. | 360/125.3 |
| 8,154,825 B2* | 4/2012 | Takashita et al. | 360/125.71 |
| 8,164,854 B2* | 4/2012 | Takagishi et al. | 360/125.31 |
| 8,238,058 B2* | 8/2012 | Shimizu et al. | 360/125.02 |
| 8,270,112 B2* | 9/2012 | Funayama et al. | 360/125.31 |
| 8,295,009 B2* | 10/2012 | Yamada et al. | 360/125.3 |
| 8,325,442 B2* | 12/2012 | Koui et al. | 360/128 |
| 2006/0039089 A1* | 2/2006 | Sato | 360/324 |
| 2008/0088980 A1* | 4/2008 | Kitagawa et al. | 360/313 |

FOREIGN PATENT DOCUMENTS

| | | |
|---|---|---|
| JP | 2005-294376 | 10/2005 |
| JP | 2008-64499 | 3/2008 |
| JP | 2008-84879 | 4/2008 |

(Continued)

OTHER PUBLICATIONS

Office Action issued Jan. 21, 2013 in Japanese Application No. 2011-064252 (With English Translation).

*Primary Examiner* — Angel Castro
(74) *Attorney, Agent, or Firm* — Oblon, Spivak, McClelland, Maier & Neustadt, L.L.P.

(57) ABSTRACT

According to one embodiment, a magnetic head includes a reproducing section. The reproducing section detects a medium magnetic field recorded in a magnetic recording medium. The reproducing section includes a stacked film and a magnetic field application unit. The stacked film includes a first magnetization layer and a second magnetization layer. The first magnetization layer has a perpendicular magnetic anisotropy. A magnetization of the first magnetization layer being is fixed. The second magnetization layer is stacked with the first magnetization layer and oscillates. The magnetic field application unit is stacked with the stacked film and applies a bias magnetic field having a component along the first axis to the stacked film. A resistance of the stacked film changes in accordance with the medium magnetic field when a current not less than a value at which the second magnetization layer oscillates is passed.

10 Claims, 14 Drawing Sheets

(56) References Cited

FOREIGN PATENT DOCUMENTS

| | | |
|---|---|---|
| JP | 2008-123669 | 5/2008 |
| JP | 2008-305486 | 12/2008 |
| JP | 2009-70541 | 4/2009 |
| JP | 2010-40060 | 2/2010 |
| JP | 2010-123226 | 6/2010 |

* cited by examiner

MAGNETIC HEAD WITH STACKED MAGNETIC LAYERS, MAGNETIC HEAD ASSEMBLY, AND MAGNETIC RECORDING/REPRODUCING APPARATUS

CROSS-REFERENCE TO RELATED APPLICATIONS

This application is based upon and claims the benefit of priority from the prior Japanese Patent Application No. 2011-064252, filed on Mar. 23, 2011; the entire contents of which are incorporated herein by reference.

FIELD

Embodiments described herein relate generally to a magnetic head, a magnetic head assembly, and a magnetic recording/reproducing apparatus.

BACKGROUND

In a magnetic recording/reproducing apparatus, the information stored in a magnetic recording medium such as hard disk drive is read out by a magnetoresistive effect magnetic head. When the recording density is increased, particularly magnetic noise becomes a problem. Suppressing noise is important in increasing the recording density.

DETAILED DESCRIPTION

Figure 1:
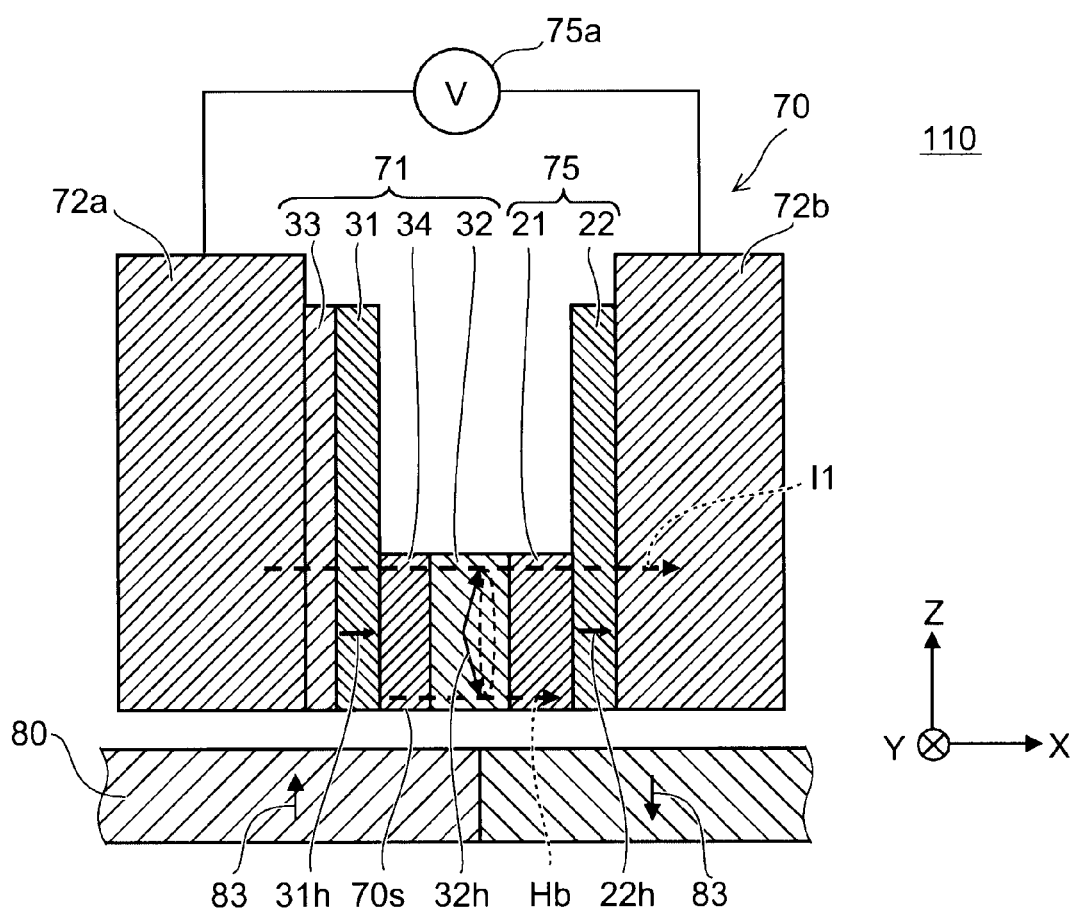
FIG. 1 is a schematic cross-sectional view illustrating the configuration of a magnetic head according to a first embodiment.

In general, according to one embodiment, a magnetic head includes a reproducing section. The reproducing section is configured to detect a medium magnetic field recorded in a magnetic recording medium. The reproducing section includes a stacked film and a magnetic field application unit. The stacked film includes a first magnetization layer and a second magnetization layer. The first magnetization layer has a perpendicular magnetic anisotropy. A magnetization of the first magnetization layer is fixed. The second magnetization layer is stacked with the first magnetization layer along a first axis and configured to oscillate. The magnetic field application unit is stacked with the stacked film along the first axis and configured to apply a bias magnetic field having a component along the first axis to the stacked film. A resistance of the stacked film is configured to change in accordance with the medium magnetic field when a current not less than a value at which the second magnetization layer oscillates is passed between the first magnetization layer and the second magnetization layer.

In general, according to another embodiment, a magnetic head includes an electromagnet, a heating unit, and a reproducing section. The electromagnet is configured to apply a recording magnetic field to a magnetic recording medium in a writing operation in which information is recorded on the magnetic recording medium. The heating unit is juxtaposed to the electromagnet and is configured to heat the magnetic recording medium locally in the writing operation. The reproducing section is juxtaposed to the electromagnet and configured to detect a medium magnetic field recorded in the magnetic recording medium. The reproducing section includes a stacked film. The stacked film includes a first magnetization layer and a second magnetization layer. The first magnetization layer has a perpendicular magnetic anisotropy. A magnetization of the first magnetization layer is fixed. The second magnetization layer is stacked with the first magnetization layer along a first axis and configured to oscillate, A resistance of the stacked film is configured to change in accordance with the medium magnetic field when a bias magnetic field having a component along the first axis is applied from the electromagnet to the stacked film and a current not less than a value at which the second magnetization layer oscillates is passed between the first magnetization layer and the second magnetization layer in a reproducing operation in which the medium magnetic field recorded in the magnetic recording medium is detected.

In general, according to another embodiment, a magnetic head assembly includes a magnetic head, a suspension, and an actuator arm. The magnetic head is installed on one end of the suspension. The actuator arm is connected to another end of the suspension. The magnetic head includes a reproducing section. The reproducing section is configured to detect a medium magnetic field recorded in a magnetic recording medium. The reproducing section includes a stacked film and a magnetic field application unit. The stacked film includes a first magnetization layer and a second magnetization layer.

The first magnetization layer has a perpendicular magnetic anisotropy. A magnetization of the first magnetization layer is fixed. The second magnetization layer is stacked with the first magnetization layer along a first axis and configured to oscillate. The magnetic field application unit is stacked with the stacked film along the first axis and configured to apply a bias magnetic field having a component along the first axis to the stacked film. A resistance of the stacked film is configured to change in accordance with the medium magnetic field when a current not less than a value at which the second magnetization layer oscillates is passed between the first magnetization layer and the second magnetization layer.

In general, according to another embodiment, a magnetic head assembly includes a magnetic head, a suspension, and an actuator arm. The magnetic head is installed on one end of the suspension. The actuator arm is connected to another end of the suspension. The magnetic head includes an electromagnet, a heating unit, and a reproducing section. The electromagnet is configured to apply a recording magnetic field to a magnetic recording medium in a writing operation in which information is recorded on the magnetic recording medium. The heating unit is juxtaposed to the electromagnet and configured to heat the magnetic recording medium locally in the writing operation. The reproducing section is juxtaposed to the electromagnet and configured to detect a medium magnetic field recorded in the magnetic recording medium. The reproducing section includes a stacked film. The stacked film includes a first magnetization layer and a second magnetization layer. The first magnetization layer has a perpendicular magnetic anisotropy. A magnetization of the first magnetization layer is fixed. The second magnetization layer is stacked with the first magnetization layer along a first axis and configured to oscillate. The resistance of the stacked film is configured to change in accordance with the medium magnetic field when a bias magnetic field having a component along the first axis is applied from the electromagnet to the stacked film and a current not less than a value at which the second magnetization layer oscillates is passed between the first magnetization layer and the second magnetization layer in a reproducing operation in which the medium magnetic field recorded in the magnetic recording medium is detected.

In general, according to another embodiment, a magnetic recording/reproducing apparatus includes a magnetic head assembly and a magnetic recording medium. The magnetic head assembly includes a magnetic head, a suspension, and an actuator arm. The magnetic head is installed on one end of the suspension. The actuator arm is connected to another end of the suspension. Information in the magnetic recording medium is reproduced using the magnetic head installed on the magnetic head assembly. The magnetic head includes a reproducing section. The reproducing section is configured to detect a medium magnetic field recorded in the magnetic recording medium. The reproducing section includes a stacked film and a magnetic field application unit. The stacked film includes a first magnetization layer and a second magnetization layer. The first magnetization layer has a perpendicular magnetic anisotropy. A magnetization of the first magnetization layer being is fixed. The second magnetization layer is stacked with the first magnetization layer along a first axis and configured to oscillate. The magnetic field application unit is stacked with the stacked film along the first axis and configured to apply a bias magnetic field having a component along the first axis to the stacked film. A resistance of the stacked film is configured to change in accordance with the medium magnetic field when a current not less than a value at which the second magnetization layer oscillates is passed between the first magnetization layer and the second magnetization layer.

In general, according to another embodiment, a magnetic recording/reproducing apparatus includes a magnetic head assembly and a magnetic recording medium. The magnetic head assembly includes a magnetic head, a suspension, and an actuator arm. The magnetic head is installed on one end of the suspension. The actuator arm is connected to another end of the suspension. Information in the magnetic recording medium is reproduced using the magnetic head installed on the magnetic head assembly. The magnetic head includes an electromagnet, a heating unit, and a reproducing section. The electromagnet is configured to apply a recording magnetic field to the magnetic recording medium in a writing operation in which information is recorded on the magnetic recording medium. The heating unit is juxtaposed to the electromagnet and configured to heat the magnetic recording medium locally in the writing operation. The reproducing section is juxtaposed to the electromagnet and configured to detect a medium magnetic field recorded in the magnetic recording medium. The reproducing section includes a stacked film. The stacked film includes a first magnetization layer and a second magnetization layer. The first magnetization layer has a perpendicular magnetic anisotropy. A magnetization of the first magnetization layer is fixed. The second magnetization layer is stacked with the first magnetization layer along a first axis and configured to oscillate. A resistance of the stacked film is configured to change in accordance with the medium magnetic field when a bias magnetic field having a component along the first axis is applied from the electromagnet to the stacked film and a current not less than a value at which the second magnetization layer oscillates is passed between the first magnetization layer and the second magnetization layer in a reproducing operation in which the medium magnetic field recorded in the magnetic recording medium is detected.

In general, according to another embodiment, a magnetic recording/reproducing apparatus includes a magnetic recording medium, a magnetic head, and a control unit. The magnetic head includes an electromagnet and a stacked film. The electromagnet is opposed to the magnetic recording medium. The stacked film is juxtaposed to the electromagnet and includes a first magnetization layer and a second magnetization layer. The first magnetization layer has a perpendicular magnetic anisotropy. A magnetization of the first magnetization layer is fixed. The second magnetization layer is stacked with the first magnetization layer along a first axis and configured to oscillate. The control unit is connected to the magnetic head. In a writing operation in which information is recorded on the magnetic recording medium, the control unit is configured to make the electromagnet to apply a recording magnetic field to the magnetic recording medium and the control unit is configured to pass a current from the first magnetization layer to the second magnetization layer to cause the second magnetization layer to oscillate to generate a high-frequency magnetic field. In a reproducing operation in which a medium magnetic field recorded in the magnetic recording medium is detected, the control unit is configured to make the electromagnet to apply a bias magnetic field having an absolute value smaller than an absolute value of the recording magnetic field in the writing operation and having a component along the first axis to the stacked film and the control unit being configured to pass a current from the first magnetization layer to the second magnetization layer to cause the second magnetization layer to oscillate with a frequency lower than a frequency of the high-frequency magnetic field in the writing operation. In the reproducing operation, a resistance of the stacked film is configured to change in accordance with the medium magnetic field.

Various embodiments will be described hereinafter with reference to the accompanying drawings.

The drawings are schematic or conceptual; and the relationships between the thicknesses and the widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic cross-sectional view illustrating the configuration of a magnetic head according to a first embodiment.

Figure 2:
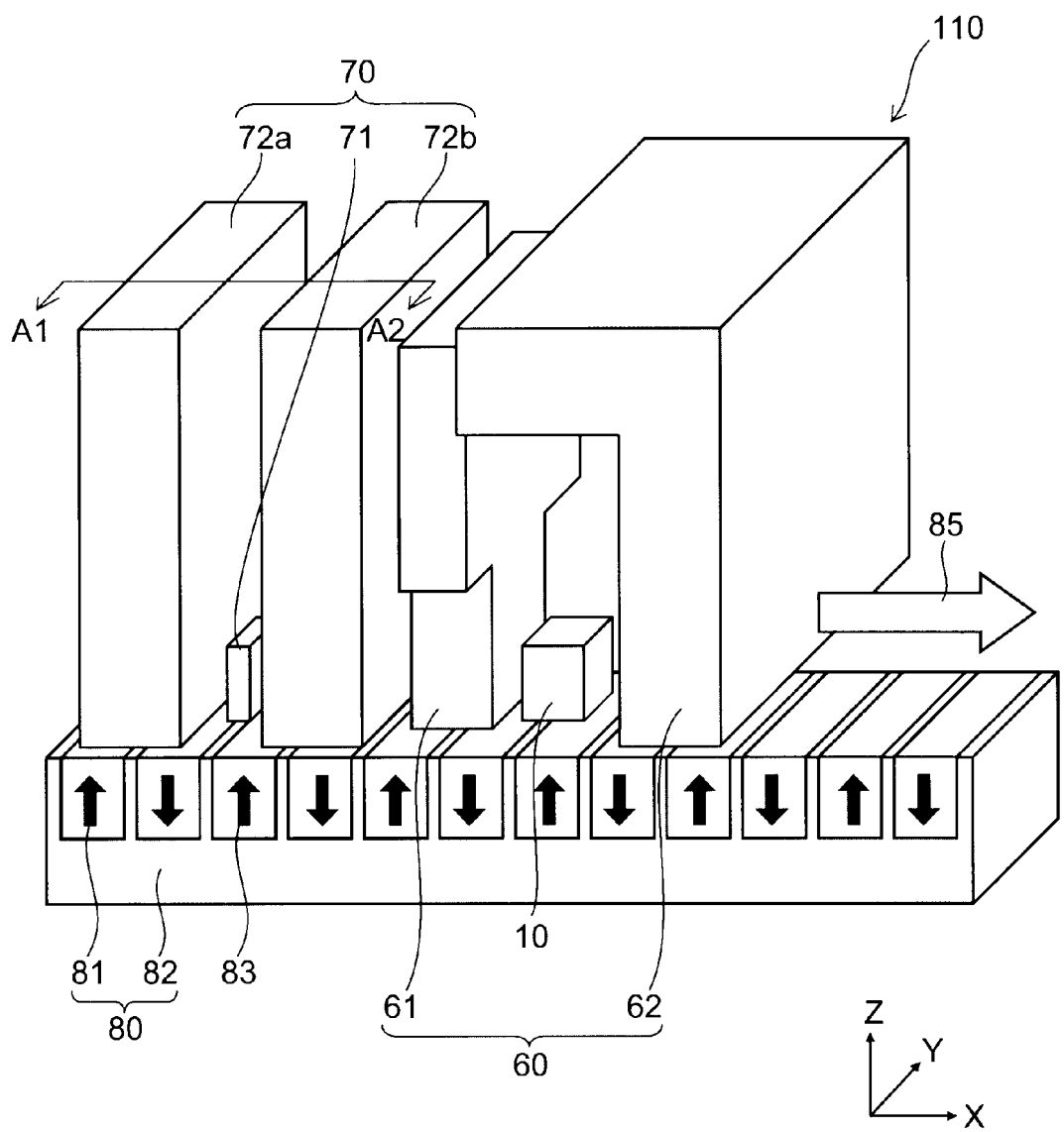
FIG. 2 is a schematic perspective view illustrating the configuration of the magnetic head according to the first embodiment.

FIG. 2 is a schematic perspective view illustrating the configuration of the magnetic head according to the first embodiment.

Figure 3:
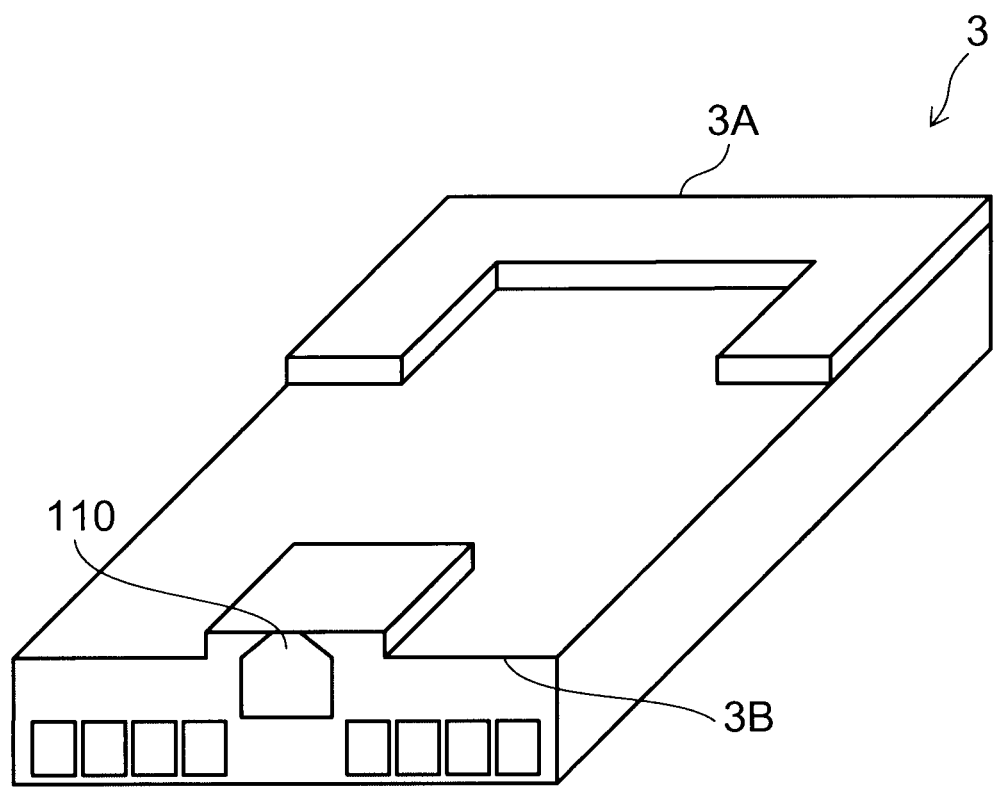
FIG. 3 is a schematic perspective view illustrating the configuration of a head slider on which the magnetic head according to the first embodiment is installed.

FIG. 3 is a schematic perspective view illustrating the configuration of a head slider on which the magnetic head according to the first embodiment is installed.

FIG. 1 is a cross-sectional view taken along line A1-A2 of FIG. 2.

First, an overview of the configuration and on overview of the operation of the magnetic head according to the embodiment are described with reference to FIG. 2 and FIG. 3.

As shown in FIG. 2, a magnetic head 110 includes a reproducing section 70 (a reproducing head section). The magnetic head 110 may further include a writing section 60 (a writing head section).

The writing section 60 includes, for example, a main magnetic pole 61 and a writing section return path 62. In the magnetic head 110, the writing section 60 may further include a portion assisting the writing operation of a spin torque oscillator (STO) 10 and the like. In other words, the writing section 60 of the magnetic head 110 may have an arbitrary configuration.

The reproducing section 70 includes, for example, a stacked film 71, a first magnetic shield 72a, and a second magnetic shield 72b. The stacked film 71 is, for example, a magnetoresistive effect device.

The stacked film 71 is provided between the first magnetic shield 72a and the second magnetic shield 72b. As described later, the first magnetic shield 72a and the second magnetic shield 72b are provided as necessary and may be omitted.

The components of the reproducing section 70 mentioned above and the components of the writing section 60 mentioned above are isolated by, for example, an alumina insulator (not shown).

As shown in FIG. 3, the magnetic head 110 is installed on a head slider 3. $Al_2O_3$/TiC and the like, for example, are used for the head slider 3.

The head slider 3 moves relative to a magnetic recording medium 80 such as a magnetic disk while floating above or being in contact with the magnetic recording medium 80.

The head slider 3 has an air inflow side 3A and an air outflow side 3B, for example. The magnetic head 110 is placed on the side surface of the air outflow side 3B of the head slider 3 or the like. Thereby, the magnetic head 110 installed on the head slider 3 moves relative to the magnetic recording medium 80 while floating above or being in contact with the magnetic recording medium 80.

As shown in FIG. 2, the magnetic recording medium 80 includes, for example, a medium substrate 82 and a magnetic recording layer 81 provided on the medium substrate 82. The magnetization 83 of the magnetic recording layer 81 is controlled by the magnetic field applied from the writing section 60, and thereby the writing operation is performed. At this time, the magnetic recording medium 80 moves relative to the magnetic head 110 along the medium moving direction 85.

The reproducing section 70 is placed opposite to the magnetic recording medium 80. The magnetic recording medium 80 moves relative to the magnetic head 110 along the medium moving direction 85. The reproducing section 70 detects the direction of the magnetization 83 of the magnetic recording layer 81. Thereby, the reproducing operation is performed.

The axis in the direction from the magnetic recording medium 80 toward the reproducing section 70 is defined as a Z-axis, for example. One axis perpendicular to the Z-axis is defined as an X-axis. The axis perpendicular to the Z-axis and the X-axis is defined as a Y-axis. The X-axis, the Z-axis, and the Y-axis are defined as a first axis, a second axis, and a third axis, respectively. The Z-axis direction is the height direction. The X-axis direction corresponds to, for example, the recording track traveling direction of the magnetic recording medium 80. The Y-axis direction corresponds to, for example, the recording track width direction of the magnetic recording medium 80.

FIG. 1 illustrates the configuration of the reproducing section 70.

As shown in FIG. 1, the magnetic head 110 according to the embodiment includes the reproducing section 70. The reproducing section 70 detects the medium magnetic field (the magnetization 83) recorded in the magnetic recording medium 80. The reproducing section 70 includes a medium facing surface 70s (ABS, air bearing surface) opposed to the magnetic recording medium 80.

The reproducing section 70 includes the stacked film 71 and a magnetic field application unit 75. As described above, the reproducing section 70 may include the first magnetic shield 72a and the second magnetic shield 72b.

In this specific example, the stacked film 71 and the magnetic field application unit 75 are disposed between the first magnetic shield 72a and the second magnetic shield 72b. For example, the stacked film 71 is placed between the first magnetic shield 72a and the magnetic field application unit 75. Furthermore, for example, the magnetic field application unit 75 is placed between the stacked film 71 and the second magnetic shield 72b.

The stacked film 71 includes a first magnetization layer 31 and a second magnetization layer 32. The axis in the direction from the first magnetization layer 31 toward the second magnetization layer 32 is taken as the X-axis (the first axis).

The first magnetization layer 31 has a perpendicular magnetic anisotropy. The magnetization of the first magnetization layer 31 (a first magnetization layer magnetization 31h) is fixed. The direction of the magnetization of the first magnetization layer 31 is fixed.

In the specification of this application, the perpendicular magnetic anisotropy refers to the property that the magnetization is easily directed to a perpendicular-to-plane direction (a direction parallel to the film thickness direction) of the magnetization (if the magnetization is directed to a perpendicular-to-plane direction, the magnetic energy decreases). That is, in the first magnetization layer 31 having a perpendicular magnetic anisotropy, the magnetization (the first magnetization layer magnetization 31h) along the X-axis is larger than the magnetization along the Y-axis and larger than the magnetization along the Z-axis.

The second magnetization layer 32 is stacked with the first magnetization layer 31 along the X-axis. In the second magnetization layer 32, spin torque oscillation is generated. That is, the second magnetization layer 32 is configured to oscillate. In this specific example, the first magnetization layer 31 is placed between the first magnetic shield 72a and the second magnetization layer 32. The second magnetization layer 32 functions as, for example, a magnetic field detection layer.

In the specification of this application, "stack" includes not only the case of being directly stacked but also the case of being stacked via other components.

In this specific example, the stacked film 71 further includes an intermediate layer 34 (a spin torque transfer layer). The intermediate layer 34 is provided between the first magnetization layer 31 and the second magnetization layer 32. The intermediate layer 34 has the function of transferring the spin torque of the first magnetization layer 31 to the second magnetization layer 32.

In this specific example, the stacked film 71 further includes an underlayer 33. The underlayer 33 is placed between the first magnetic shield 72a and the first magnetization layer 31.

In this specific example, the magnetic field application unit 75 includes a second magnetization fixed layer 22 and a nonmagnetic layer (a second nonmagnetic layer 21). The second magnetization fixed layer 22 is placed between the second magnetization layer 32 of the stacked film 71 and the second magnetic shield 72b. The second nonmagnetic layer 21 is placed between the second magnetization layer 32 of the stacked film 71 and the second magnetization fixed layer 22.

In other words, the second magnetization fixed layer 22 is stacked with the stacked film 71 along the X-axis. The second magnetization fixed layer 22 has a perpendicular magnetic anisotropy. The magnetization of the second magnetization fixed layer 22 (a second magnetization fixed layer magnetization $22h$) is fixed in the direction of the magnetization of the first magnetization layer 31. The direction of the magnetization of the second magnetization fixed layer 22 is the same as the direction of the magnetization of the first magnetization layer 31.

The second nonmagnetic layer 21 is provided between the stacked film 71 and the second magnetization fixed layer 22. A nonmagnetic material is used for the second nonmagnetic layer 21. The second magnetization layer 32 is placed between the first magnetization layer 31 and the second nonmagnetic layer 21.

The underlayer 33 is formed on the first magnetic shield 72a, for example. The first magnetization layer 31 is formed on the underlayer 33. The intermediate layer 34 is formed on the first magnetization layer 31. The second magnetization layer 32 is formed on the intermediate layer 34. The second nonmagnetic layer 21 is formed on the second magnetization layer 32. The second magnetization fixed layer 22 is formed on the second nonmagnetic layer 21. The second magnetic shield 72b is formed on the second magnetization fixed layer 22. The second nonmagnetic layer 21 is, for example, a cap layer.

Thus, the magnetic field application unit 75 is stacked with the stacked film 71 along the X-axis. The magnetic field application unit 75 applies a bias magnetic field Hb having a component along the X-axis to the stacked film 71.

In the reproducing section 70, a current I1 can be passed along the X-axis between the first magnetization layer 31 and the second magnetization layer 32. For, example, the current I1 can be passed along the X-axis from the first magnetization layer 31 to the second magnetization layer 32. That is, in the reproducing section 70 of the magnetic head 110 according to the embodiment, a sense current flows in the direction perpendicular to the film surface of the magnetoresistive effect film. When the current I1 flows from the first magnetization layer 31 to the second magnetization layer 32, an electronic current flows from the second magnetization layer 32 to the first magnetization layer 31.

A first current supply unit 75a is provided that is electrically connected to the first magnetization layer 31 and the second magnetization layer 32, for example. In this specific example, the first current supply unit 75a is electrically connected to the first magnetic shield 72a and the second magnetic shield 72b. The current I1 is supplied to the first magnetization layer 31 and the second magnetization layer 32 (to the stacked film 71) via the first magnetic shield 72a, the second magnetic shield 72b, and the magnetic field application unit 75.

In the reproducing section 70, when a current I1 not less than a value (threshold value) at which the second magnetization layer 32 makes spin torque oscillation is passed from the first magnetization layer 31 to the second magnetization layer 32, the resistance of the stacked film 71 changes in accordance with the medium magnetic field (the magnetization 83) of the magnetic recording medium 80. More specifically, the resistance of the stacked film 71 changes in accordance with at least one of the magnitude and direction of the medium magnetic field of the magnetic recording medium 80. The resistance of the stacked film 71 is the resistance along the X-axis of the stacked film 71. The resistance of the stacked film 71 includes at least the resistance between both ends of the first magnetization layer 31 and the resistance between both ends of the second magnetization layer 32.

A spin torque is injected from the first magnetization layer 31 into the second magnetization layer 32. The first magnetization layer 31 functions as a spin injection layer. In this example, the spin torque of the first magnetization layer 31 is transferred to the second magnetization layer 32 via the intermediate layer 34. The magnetization of the second magnetization layer 32 (a second magnetization layer magnetization $32h$) rotates largely in the layer surface due to the transferred spin torque.

Thus, the first magnetic shield 72a and the second magnetic shield 72b can function as electrodes. NiFe and the like, for example, are used for the first magnetic shield 72a and the second magnetic shield 72b.

In this example, the current I1 flows through the stacked film 71 via the magnetic field application unit 75. That is, the magnetic field application unit 75 can function as an electrode.

Materials that are preferably used as the underlayer 33 include, for example, a single-layer film or a stacked film of Ta, Ru, Cu, Ti, and/or the like. The underlayer 33 preferably has a thin thickness. Thereby, the reproducing resolution is improved. The thickness of the underlayer 33 is appropriately set from the viewpoints of the improvement in the film quality of the stacked film 71 and reproducing resolution.

A Co/Ni artificial lattice film, for example, is preferably used as the first magnetization layer 31. Thereby, both a high MR ratio (high polarization) and a large perpendicular magnetic anisotropy are obtained.

CoPt, FePt, a Co/Pd artificial lattice, a Co/Pt artificial lattice, and the like having a large perpendicular magnetic anisotropy, for example, may be used for the first magnetization layer 31. In this case, for example, a thin high polarizability material layer is preferably interposed at the interface between the first magnetization layer 31 and the intermediate layer 34. The thickness of the high polarizability material layer is, for example, not less than 0.5 nanometers (nm) and not more than 3 nm. As the high polarizability material layer, for example, FeCo, an FeCo/Cu/FeCo stacked film, or a layer of a Heusler ordered alloy with a short spin diffusion length (FeCoAlSi, CoMnGe, etc.), FeCoGe, FeCoAl, FeCoSi, and the like may be used. A short spin diffusion length enables sufficient polarization even in a thin layer. Thereby, the efficiency of the spin torque transfer to the second magnetization layer 32 (a magnetic field detection layer) can be improved. If the high polarizability material layer is thick, the perpendicular magnetic anisotropy of the whole first magnetization layer 31 is weakened. Therefore, the thickness of the high polarizability material layer is set thin.

Cu, Ag, and the like, for example, are used for the intermediate layer 34. Thereby, a high MR ratio and a high spin torque transfer efficiency are obtained. That is, a high-density current can be injected and a low resistance can be obtained. The intermediate layer 34 preferably has a thin thickness. The intermediate layer 34 is provided as necessary and may be omitted. Furthermore, also a hybrid layer that includes an oxide layer such as ZnO and MgO and conductive portions scattered in the oxide layer may be used as the intermediate layer 34. Thereby, although the resistance increases, the MR ratio can be improved.

An FeCo-based alloy, a Heusler alloy, and the like, for example, may be used for the second magnetization layer 32. Thereby, a high MR ratio is obtained. The thickness of the second magnetization layer 32 is preferably not more than 10 nm from the viewpoint of high resolution. The thickness of the second magnetization layer 32 is preferably thick in order to increase the MR ratio. The thickness of the second magnetization layer 32 is appropriately set from these points of view. In the second magnetization layer 32, the magnetization is preferably easily directed to in-plane directions. In an in-plane magnetic anisotropy, the magnetization is directed more easily to directions parallel to the film surface than to directions perpendicular to the film surface. By the second magnetization layer 32 having an in-plane magnetic anisotropy, the oscillation in the magnetic free layer 32 is stabilized.

If the thickness (the width along the X-axis) of the second magnetization layer 32 is approximately equal to the width along the Y-axis or the width along the Z-axis, the magnetization stabilization in the film surface is difficult due to the demagnetizing field. In this case, a negative perpendicular magnetic anisotropy such as that of an Fe/Co stacked film is preferably used as at least part of the second magnetization layer 32. Furthermore, in the second magnetization layer 32, a stacked configuration may be used such as a magnetic layer/Ru layer/magnetic layer, which is antiferromagnetically coupled via the Ru layer, in order to stabilize the magnetization in the film surface.

The width along the Y-axis (the width in the track width direction) of the first magnetization layer 31 is preferably larger than the width along the Y-axis of the second magnetization layer 32. The width along the Z-axis (the width in the height direction) of the first magnetization layer 31 is preferably larger than the width along the Z-axis of the second magnetization layer 32. In other words, the width of the first magnetization layer 31 along an axis perpendicular to the X-axis is preferably larger than the width of the second magnetization layer 32 along the axis perpendicular to the X-axis.

Thereby, the disorder of the magnetization due to the reaction spin torque from the second magnetization layer 32 can be suppressed. Furthermore, the second magnetization layer 32, which actually detects a medium magnetic field with a narrow track width, can be patterned into an ultrafine form with ease from the viewpoint of processes. That is, in the process of the width along the Y-axis of the second magnetization layer 32, the width along the Y-axis and the etching depth can be made approximately equal. Furthermore, the resistance of the reproducing section 70 can be reduced.

The width of the second magnetization layer 32 along the Y-axis (the axis perpendicular to the Z-axis in the direction from the magnetic recording medium 80 toward the reproducing section 70 and the X-axis) is set substantially equal to the recording track width of the magnetic recording medium 80.

The width of the second magnetization layer 32 along the Z-axis (the axis in the direction that is perpendicular to the X-axis and runs from the magnetic recording medium 80 toward the reproducing section 70) is preferably set not more than the width of the second magnetization layer 32 along the Y-axis (the axis perpendicular to the X-axis and the Z-axis). By setting the width along the Z-axis of the second magnetization layer 32 smaller than the width along the Y-axis of the second magnetization layer 32, the resolution of reproduction can be improved, for example.

A material that blocks the transfer of spin torque, for example, is used for the second nonmagnetic layer 21. Ta, Ru, and the like, for example, are preferably used for the second nonmagnetic layer 21.

A material that has a large saturation magnetization and a perpendicular magnetic anisotropy, for example, is preferably used for the second magnetization fixed layer 22. Thereby, a strong perpendicular magnetic field can be generated. A Co/Ni artificial lattice, a CoPt alloy, and the like, for example, may be used for the second magnetization fixed layer 22.

To stabilize the perpendicular magnetic anisotropy, another underlayer may be provided between the second magnetization fixed layer 22 and the second nonmagnetic layer 21. Ru, Cu, Ti, and the like, for example, may be used for the other underlayer.

Hereinbelow, an example of the measurement results of the characteristics of the magnetic head 110 is described.

In the sample below, the width along the Y-axis of the stacked film 71 is approximately 50 nm, and the width along the Z-axis is approximately 50 nm. An FeCo layer and a Ni layer alternately stacked along the X-axis were used as the first magnetization layer 31. The thickness of the FeCo layer is 0.2 nm. The thickness of the Ni layer is 0.6 nm. The number of FeCo layers is 25, and the number of Ni layers is 25.

An FeCoSi layer was used as the second magnetization layer 32. The thickness of the second magnetization layer 32 is approximately 10 nm. The saturation magnetization Bs of the second magnetization layer 32 is approximately 1.5 tesla (T).

FIG. 4A to FIG. 4C and FIG. 5A to FIG. 5C are schematic diagrams illustrating the characteristics of the magnetic head according to the first embodiment.

Figure 4A:
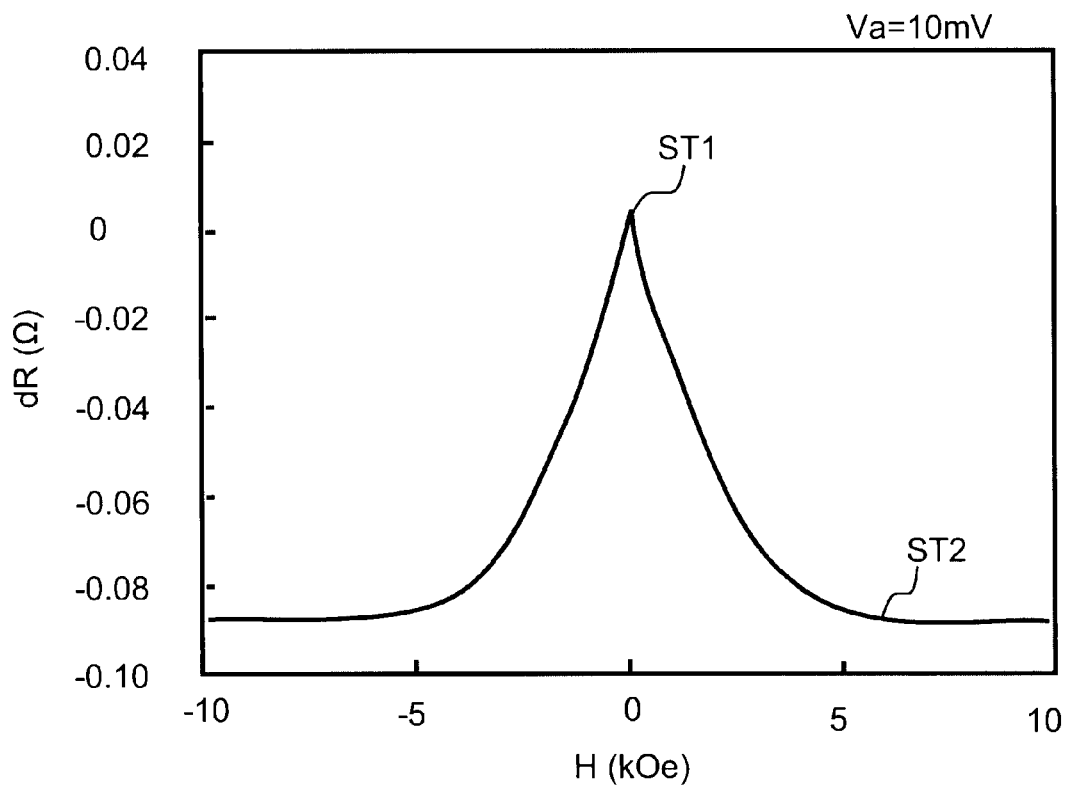
FIG. 4A to FIG. 4C and FIG. 5A to FIG. 5C are schematic diagrams illustrating the characteristics of the magnetic head according to the first embodiment.
Figures 4B, 4C:
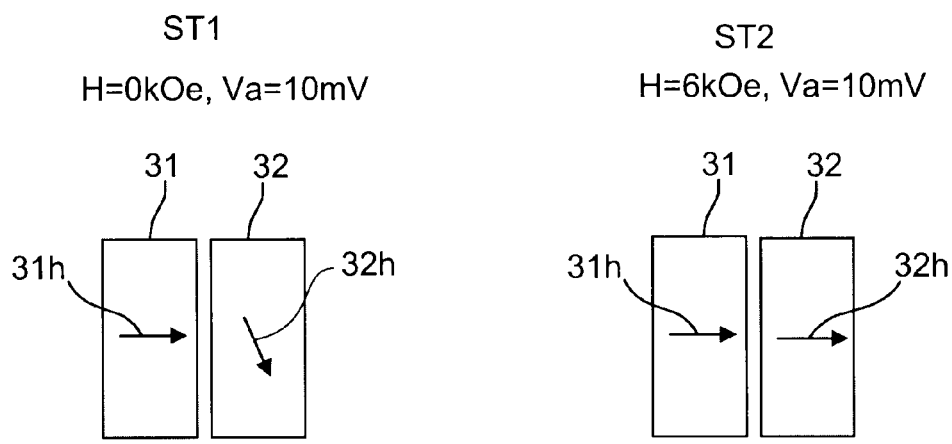
Figure 5A:
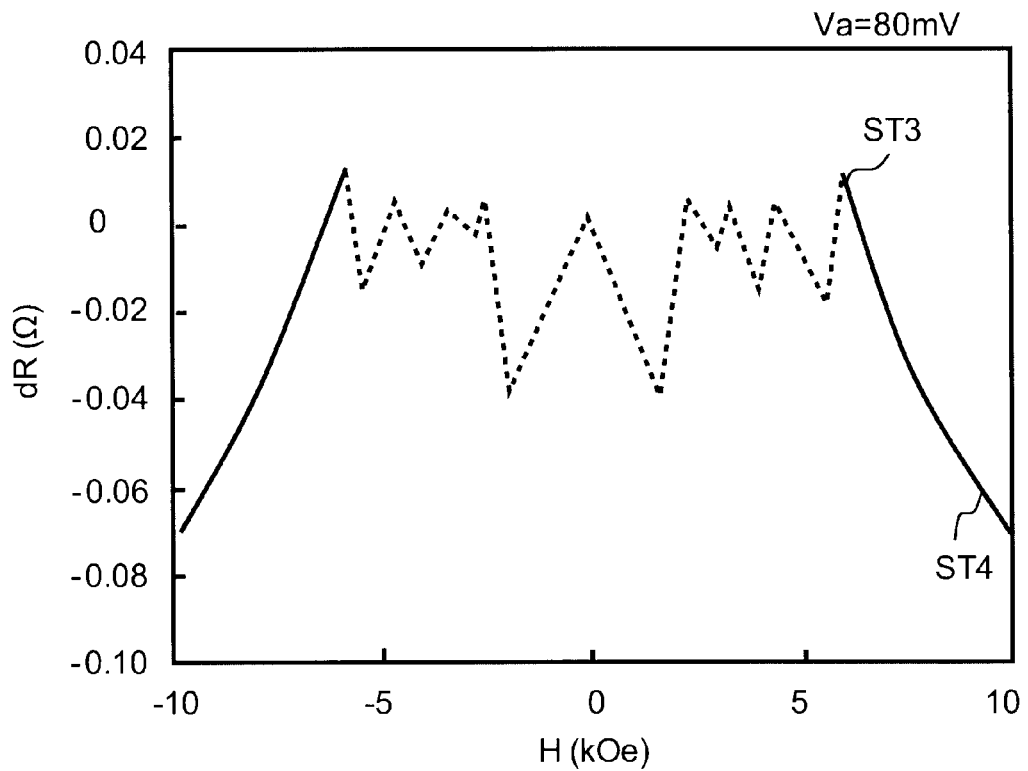
Figures 5B, 5C:
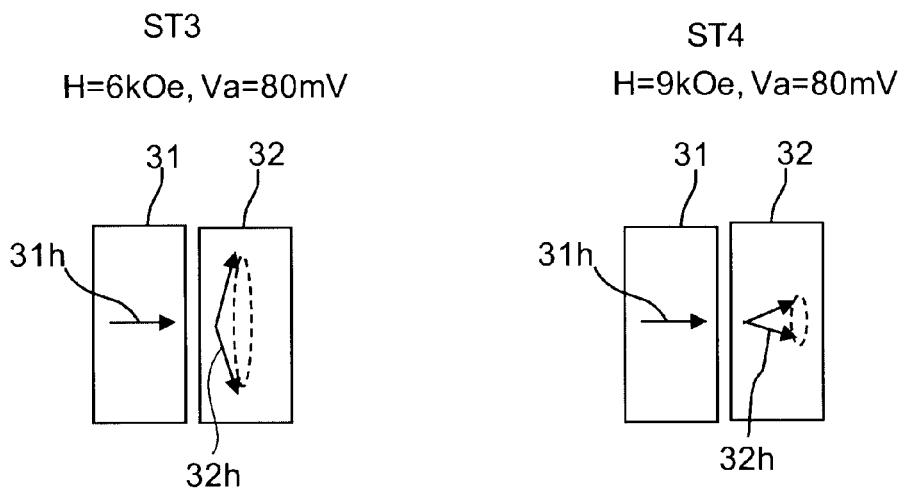

FIG. 4A to FIG. 4C correspond to the characteristics in the case where the voltage Va between the first magnetization layer 31 and the second magnetization layer 32 is approximately 10 millivolts (mV). In other words, the drawings correspond to the case where the current flowing between the first magnetization layer 31 and the second magnetization layer is smaller than the threshold. FIG. 5A to FIG. 5C correspond to the characteristics in the case where the voltage Va between the first magnetization layer 31 and the second magnetization layer 32 is approximately 80 millivolts (mV). In other words, the drawings correspond to the case where the current flowing between the first magnetization layer 31 and the second magnetization layer 32 is larger than the threshold.

FIG. 4A and FIG. 5A are graphs illustrating the measurement results of the characteristics. In the drawings, the horizontal axis represents the magnetic field H applied to the device. The magnetic field H is the magnetic field along the X-axis. The magnetic field H corresponds to, for example, the medium magnetic field to be detected of the magnetic recording medium 80. The vertical axis represents the resistance change dR of the device.

FIG. 4B, FIG. 4C, FIG. 5B, and FIG. 5C schematically illustrate states of the magnetizations of the first magnetization layer 31 and the second magnetization layer 32. FIG. 4B corresponds to a first state ST1 (the voltage Va=10 mV, and the magnetic field H=0 kOe) illustrated in FIG. 4A. FIG. 4C corresponds to a second state ST2 (the voltage Va=10 mV, and the magnetic field H=6 kOe) illustrated in FIG. 4A. FIG. 5B corresponds to a third state ST3 (the voltage Va=80 mV, and the magnetic field H=6 kOe) illustrated in FIG. 5A. FIG. 5C corresponds to a fourth state ST4 (the voltage Va=80 mV, and the magnetic field H=9 kOe) illustrated in FIG. 5A.

As shown in FIG. 4A, in the case where the voltage Va is 10 mV, the resistance when the magnetic field H is 0 kOe is high. The resistance decreases as the absolute value of the magnetic field H increases.

As shown in FIG. 4B, in the first state ST1 where the magnetic field H is 0 kOe, the second magnetization layer magnetization 32h is inclined with respect to the X-axis due to the effect of the stray magnetic field from the first magnetization layer 31. In other words, the second magnetization layer magnetization 32h is slightly inclined from the in-plane direction to the perpendicular-to-plane direction. As a result, the angle between the first magnetization layer magnetization 31h and the second magnetization layer magnetization 32h is nearly 90 degrees.

When the voltage Va is 10 mV, the spin torque is weak. Hence, the resistance decreases as the absolute value of the magnetic field H increases. The resistance becomes substantially constant in the magnetic field H ranging approximately from 3 kOe to 4 kOe.

As shown in FIG. 4C, in the second state ST2, the second magnetization layer magnetization 32h is directed to substantially the same direction as the first magnetization layer magnetization 31h. That is, the second magnetization layer magnetization 32h lies along the X-axis.

In the state illustrated in FIG. 4A to FIG. 4C where the current is small, spin torque oscillation is not generated even in the case where the magnetic field H is large.

As shown in FIG. 5A, when the voltage Va is 80 mV, in a region of the absolute value of the magnetic field H of not less than 6 kOe and not more than 10 kOe, the resistance decreases as the absolute value of the magnetic field H increases. In this region, the relationship between the absolute value of the magnetic field H and the resistance change dR is almost linear.

As shown in FIG. 5B, at the time of the third state ST3 where the magnetic field H is 6 kOe, the angle between the first magnetization layer magnetization 31h and the second magnetization layer magnetization 32h is nearly 90 degrees. The third state ST3 is a high resistance state.

As shown in FIG. 5C, at the time of the fourth state ST4 where the magnetic field H is 9 kOe, the angle between the first magnetization layer magnetization 31h and the second magnetization layer magnetization 32h decreases to come close to zero degrees. The fourth state ST4 is a low resistance state.

In the state illustrated in FIG. 5A to FIG. 5C where the current is large, spin torque oscillation is generated when the magnetic field H is large (the magnetic field H is 6 kOe or more). The oscillation frequency in such a region where the resistance changed substantially linearly was approximately not less than 20 GHz and not more than 25 GHz.

In the magnetic head 110 according to the embodiment, the property that the resistance changes substantially linearly is utilized.

That is, when a current I1 not less than the threshold (the threshold for the second magnetization layer 32 making spin torque oscillation) is passed from the first magnetization layer 31 to the second magnetization layer 32 (in the example mentioned above, when a voltage Va of 80 mV is applied), the resistance of the stacked film 71 changes in accordance with the medium magnetic field. By detecting the change in the resistance, the medium magnetic field is detected. That is, the direction of the magnetization 83 recorded in the magnetic recording medium 80 is detected and the information recorded is read out.

In regard to spin torque oscillators (STOs), many researches and developments are carried out on the oscillation characteristics thereof. However, there is no idea that the change in the resistance of the STO due to a magnetic field is utilized for the reproducing section of a magnetic head.

By the original experiments mentioned above performed by the inventor, the inventor has found that the resistance of the STO changes due to a magnetic field as illustrated in FIG. 5A. Furthermore, the change is substantially linear (for example, in a region where the magnetic field H=6 kOe to 10 kOe). The new findings have led to the construction of the configuration of the magnetic head according to the embodiment.

In general, it is expected from theory that reducing the device size will suppress the production of magnons and facilitate the generation of uniform oscillation caused by spin torque. Also in the experiments, if the device size is increased, it becomes difficult to obtain such linear magnetic field-resistance characteristics as are illustrated in FIG. 5A. Conversely, if the device size is reduced, the thermal fluctuation noise of the magnetization is expected to be suppressed by uniform oscillation.

On the other hand, even when a magnetic field of 10 kOe, which is a magnitude corresponding to the medium magnetic field, was applied along the X-axis from the outside, there was no change in the magnetic field-resistance characteristics illustrated in FIG. 5A.

In a reproducing head of a reference example, for example, the medium magnetic field in an in-plane direction (e.g. the medium magnetic field in the Z-axis direction) of the magnetoresistive effect film is detected.

In contrast, in the magnetic head 110 according to the embodiment, a component perpendicular to the film surface of the stacked film 71 of the medium magnetic field (e.g. the component in the X-axis direction of the medium magnetic field) is detected. Consequently, reproduction of narrow recording bit lengths can be performed by the characteristics even if the spacing between the magnetic shields (the distance between the first magnetic shield 72a and the second magnetic shield 72b) is wide.

In the embodiment, a unique spin torque oscillation state where the magnetization rotates largely by 360 degrees with a high frequency of 10 GHz or more in the film surface of the second magnetization layer 32 (a magnetic field detection layer) can be created by a moderate bias magnetic field Hb along the X-axis (along the axis perpendicular to the film surface of the stacked film 71) and the spin injection from the first magnetization layer 31 (a perpendicular magnetic spin injection layer).

As the second magnetization layer 32 is downsized into an ultrafine form, the thermal fluctuation tends to increase. However, in the spin torque oscillation in the embodiment, the disorder of the magnetization is limited and the magnetization is uniform even in the case where the second magnetization layer 32 is downsized into an ultrafine form.

Furthermore, in the spin torque oscillation state in the embodiment, the resistance of the stacked layer 71 does not substantially change with a perpendicular-to-medium-plane direction component (e.g. the Z-axis direction component) of the medium magnetic field of the magnetic recording medium 80, and the resistance of the stacked film 71 changes almost linearly with an in-medium-plane direction component (e.g. the X-axis direction component) of the medium magnetic field of the magnetic recording medium 80. This phenomenon has been found by the inventor's experiments.

The phenomenon is caused by the fact that the angle between the magnetization of the first magnetization layer 31 and the magnetization of the second magnetization layer 32 changes based on the magnetic field of an in-medium-plane direction component (being the magnetic filed in a perpendicular-to-plane direction of the stacked film 71, e.g., the magnetic field in the X-axis direction). The resistance decreases when the direction of this magnetic field is the same as the direction of the magnetization of the first magnetization layer 31. The resistance increases when the direction of this magnetic field is opposite to the direction of the magnetization of the first magnetization layer 31.

In the case of conventional configurations, it has been considered to be theoretically difficult to achieve both the suppression of the thermal fluctuation of the magnetization and reproduction output with high sensitivity in an ultrafine magnetic layer. In contrast, the magnetic head according to the embodiment can achieve both the suppression of the thermal fluctuation of the magnetization and reproduction output with high sensitivity even in an ultrafine magnetic layer.

In conventional reproducing heads, it is difficult to utilize the medium magnetic field of an in-medium-plane direction component (e.g. the X-axis direction component). In contrast, in the magnetic head according to the embodiment, the medium magnetic field of the in-medium-plane direction component is concentrated in a transition region where the direction of the magnetization of the perpendicular magnetic medium changes, and therefore reproduction with high resolution can be performed.

If the suppression of thermal fluctuation is enabled, the length along the X-axis of the second magnetization layer 32 can be reduced. Thereby, reproduction with high resolution can be performed.

It is known that, if high frequencies of a few 10 GHz are superposed on the medium magnetic field, the magnetization 83 of the magnetic recording medium 80 is easily reversed. Also a method of high-frequency assist recording based on this phenomenon is known.

Also in the magnetic head 110 according to the embodiment, a high frequency is generated when the STO (e.g. the stacked film 71) oscillates. There is a concern that this high frequency would disturb the recording state of the magnetization 83 of the magnetic recording medium 80. The magnetic head 110 according to the embodiment is designed appropriately so as to prevent the problem.

Figure 6:
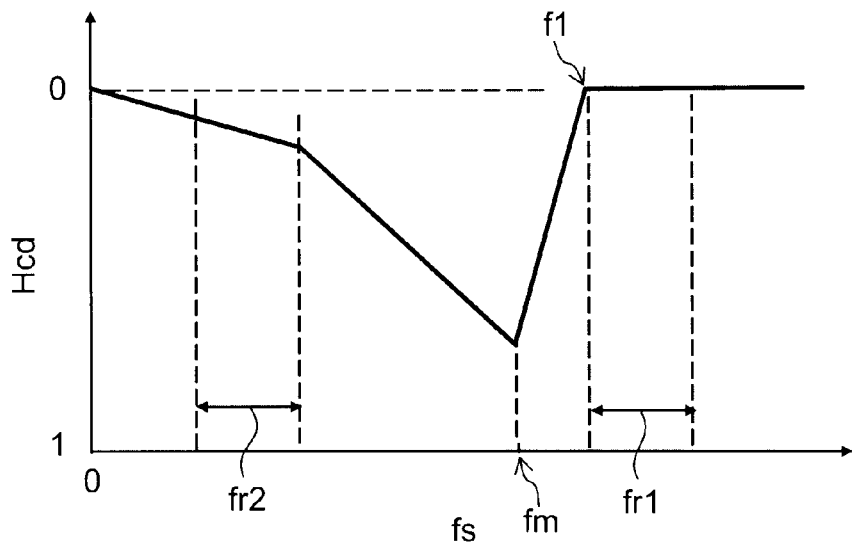
FIG. 6 is a graph illustrating the characteristics of the magnetic head according to the first embodiment.

FIG. 6 is a graph illustrating the characteristics of the magnetic head according to the first embodiment.

The horizontal axis of the drawing represents the frequency fs of the spin torque oscillation in the STO (specifically, the second magnetization layer 32). The vertical axis represents the medium coercive force reduction effect Hcd. The medium coercive force reduction effect Hcd expresses the degree to which the coercive force of the magnetic recording medium 80 is reduced due to the high frequency applied. In FIG. 6, the medium coercive force reduction effect Hcd is relative values.

The time that the medium coercive force reduction effect Hcd is zero corresponds to the coercive force not being reduced. As the medium coercive force reduction effect Hcd goes from zero to one, the effect of reducing the coercive force increases. The magnetization of the magnetic recording medium 80 is changed more easily in a region on the "1" side of the medium coercive force reduction effect Hcd than in a region on the "0" side.

As shown in FIG. 6, as the frequency fs of the spin torque oscillation of the STO increases from zero, the medium coercive force reduction effect Hcd increases. The medium coercive force reduction effect Hcd reaches a maximum when the frequency fs is a medium eigenfrequency fm. The medium eigenfrequency fm is, for example, the ferromagnetic resonance frequency of the magnetic recording medium 80. When the frequency fs becomes frequency f1 or more, the medium coercive force reduction effect Hcd becomes zero and the effect is not exhibited. In the case where the STO is used for high-frequency assist recording, the condition that the frequency fs is near the medium eigenfrequency fm is used.

In the magnetic head 110 according to the embodiment, for example, the frequency fs of the spin torque oscillation of the second magnetization layer 32 is set higher than the medium eigenfrequency fm. Specifically, for example, the frequency fs is set not less than frequency f1 at which the medium coercive force reduction effect Hcd becomes substantially zero (a first frequency range fr1). Alternatively, the frequency fs is set lower than the medium eigenfrequency fm. The frequency fs is set to, in particular, a value significantly lower than the medium eigenfrequency fm (a second frequency range fr2).

That is, in the embodiment, the frequency fs of the spin torque oscillation of the second magnetization layer 32 is set to a value in a region that does not include frequencies at which the magnetization 83 of the magnetic recording medium 80 is easily reversed.

The frequency at which the magnetization 83 of the magnetic recording medium 80 is easily reversed is approximately ⅔ the product of the magnetic anisotropic magnetic field Hk of the magnetic recording medium 80 and the gyromagnetic ratio γ. On the other hand, the frequency fs of the spin torque oscillation of the second magnetization layer 32 is approximately the product of the external magnetic field (the bias magnetic field Hb) and γ.

The bias magnetic field Hb is set so that the frequency fs of the spin torque oscillation of the second magnetization layer 32 may be distant from the reversal frequency of the magnetization 83 of the magnetic recording medium 80, for example. The frequency fs of the spin torque oscillation of the second magnetization layer 32 is preferably set, in particular, higher than the reversal frequency of the magnetization 83 of the magnetic recording medium 80. Thereby, the possibility is reduced that the magnetization 83 of the magnetic recording medium 80 will become unstable due to the spin torque oscillation of the second magnetization layer 32.

Thus, in the embodiment, the frequency fs of the spin torque oscillation of the second magnetization layer 32 is preferably higher than the ferromagnetic resonance frequency (the medium eigenfrequency fm) of the magnetic recording medium 80. The frequency fs is set, for example, higher than the product of the magnetic anisotropic magnetic field Hk of the magnetic recording medium 80 and the gyromagnetic ratio γ.

Alternatively, the frequency fs is preferably lower than the ferromagnetic resonance frequency of the magnetic recording medium 80. The frequency fs is set, for example, lower than the product of the magnetic anisotropic magnetic field Hk and the gyromagnetic ratio γ.

The frequency fs of the spin torque oscillation of the second magnetization layer 32 is substantially proportional to the current I1 passed through the second magnetization layer 32. Therefore, in the magnetic head 110, the value of the current passed between the first magnetization layer 31 and the second magnetization layer 32 is preferably set to a value that makes the frequency fs of the spin torque oscillation of the second magnetization layer 32 higher than the ferromagnetic resonance frequency of the magnetic recording medium 80.

Figure 7:
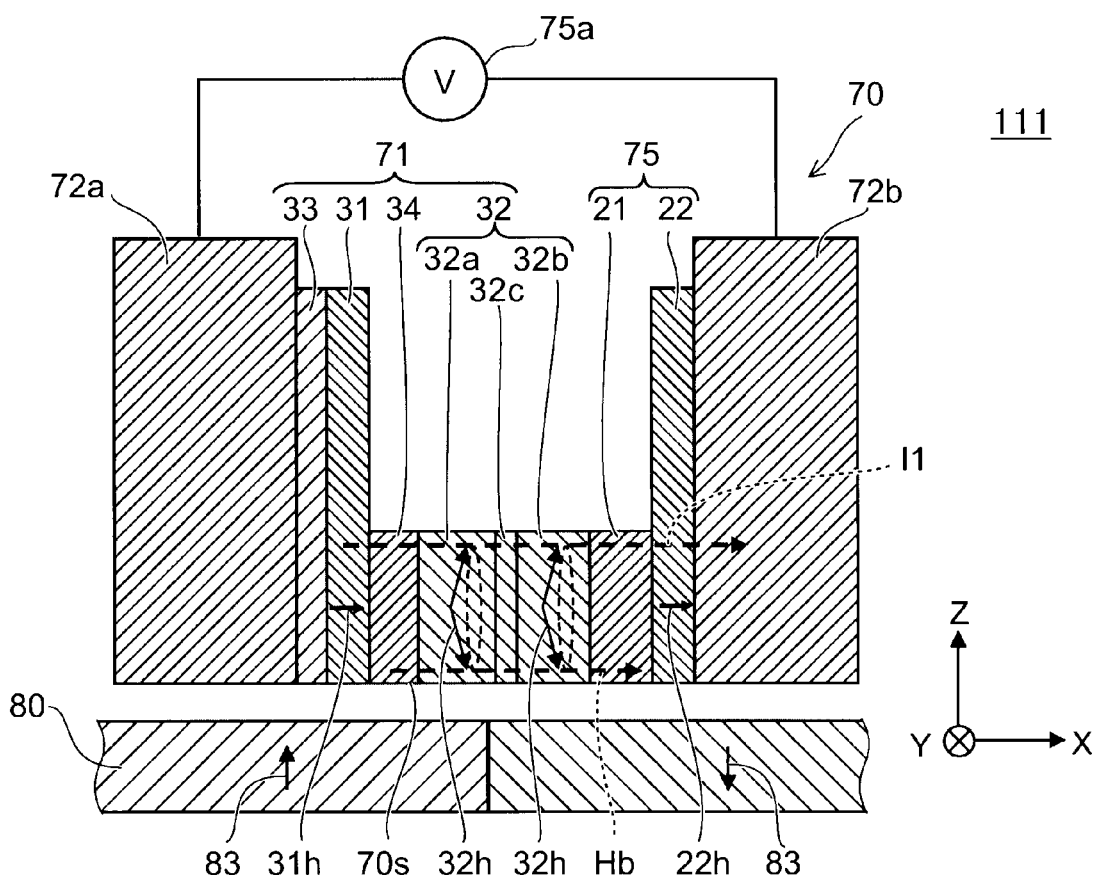
FIG. 7 is a schematic cross-sectional view illustrating the configuration of another magnetic head according to the first embodiment.

FIG. 7 is a schematic cross-sectional view illustrating the configuration of another magnetic head according to the first embodiment. As shown in FIG. 7, in a magnetic head 111 according to the embodiment, the second magnetization layer 32 includes a first magnetic layer 32a, a second magnetic layer 32b, and a nonmagnetic layer (a first nonmagnetic layer 32c).

The second magnetic layer 32b is stacked with the first magnetic layer 32a along the X-axis. The second magnetic layer 32b has a magnetization in the direction opposite to the direction of the magnetization of the first magnetic layer 32a. That is, the phase of the magnetization of the second magnetic layer 32b is different from the phase of the magnetization of the first magnetic layer 32a by 180 degrees.

The first nonmagnetic layer 32c is provided between the first magnetic layer 32a and the second magnetic layer 32b.

Otherwise, the configuration of the magnetic head 111 may be similar to that of, for example, the magnetic head 110 and a description is therefore omitted.

In the magnetic head 111, the first magnetic layer 32a and the second magnetic layer 32b make spin torque oscillation. The first magnetic layer 32a and the second magnetic layer 32b are antiferromagnetically coupled to each other, and are different in phase from each other by 180 degrees. Since the phase is different by 180 degrees, the high-frequency magnetic fields are cancelled. Thereby, the possibility can be reduced that the recording state of the magnetization 83 of the magnetic recording medium 80 will become unstable.

Furthermore, it is effective to set the magnetic thickness of the second magnetization layer 32 smaller than a prescribed value in order that the recording state of the magnetization 83 of the magnetic recording medium 80 may be stabilized by the high-frequency magnetic field generated by the spin torque oscillation of the second magnetization layer 32.

In the magnetic head according to the embodiment (e.g. the magnetic heads 110 and 111 and modifications thereof), for example, the magnetic thickness of the second magnetization layer 32 is set less than five nanometer·tesla (nm·T). Thereby, the possibility can be reduced that the recording state of the magnetization 83 of the magnetic recording medium 80 will become unstable. In high-frequency assist recording, the magnetic thickness of the STO is not less than 20 nm·T.

The magnetic thickness of the second magnetization layer 32 is the product of the thickness of the second magnetization layer 32 obtained by, for example, electron microscopic observation and the saturation magnetization determined by the material composition.

Signal reproduction of HDD (hard disk drive) uses a TMR head (tunneling magnetoresistive head) in which a current is passed in the perpendicular-to-plane direction. Reproducing devices will be downsized in the future with the increase in recording density. This requires a magnetoresistive effect device with a small resistance per unit cross-sectional area.

For example, it is expected that a reproducing device having a current-flow cross-sectional area of about 20 nm square will be required in order to achieve a surface recording density of two terabits per one square inch area (2 Tb/in$^2$). It is considered that this requires an area resistance (RA, current-flow cross-sectional area×resistance) of approximately 0.3 Ωμm$^2$ or less. In the TMR head, since a current is passed via a tunnel barrier, there are physical limitations to resistance reduction.

Furthermore, to achieve a surface recording density of 2 Tb/in$^2$ or more, it is considered that the reproducing shield spacing needs to be 20 nm or less in order to achieve high resolution reproduction. The second magnetization layer of the TMR needs to have a width of about 20 nm in order to perform reproduction for densities of narrow track widths.

However, in current TMR heads, for example, since a stacked film is provided of an antiferromagnetic film (an IrMn alloy), a magnetization fixed layer, an intermediate insulating layer, and a second magnetization layer, it is difficult to make the total thickness of them 20 nm or less. Therefore, it is difficult to place the TMR head between the reproducing shields. If the width of the second magnetization layer is narrowed to 20 nm or less, the magnetic noise resulting from thermal fluctuation becomes noticeable to make reproduction with high S/N ratio difficult. Furthermore, if the device is downsized to about 20 nm, it is considered that the magnetic noise due to spin transfer torque easily occurs even by a small current. The reproduction output is proportional to the product of the MR ratio and the current injected. Therefore, in addition to the increase in the MR ratio, the suppression of spin transfer torque is desired in order to obtain a reproducing head with high sensitivity.

That is, for example, when the recording density is as large as 2 Tb/in$^2$ or more, a low resistance, high MR ratio, high resolution, and low magnetic noise are desired.

The magnetic head according to the embodiment (e.g. the magnetic heads 110 and 111 and modifications thereof) has a low resistance, high MR ratio, high resolution, and low magnetic noise. Thereby, for example, high-density recording with a recording density of 2 Tb/in$^2$ or more can be performed.

A magnetic head of a reference example may be possible having a configuration in which two second magnetization layers are stacked via an intermediate layer (the tri-layer system). In addition, a reference example may be possible in which two sets of magnetoresistive effect devices are stacked and the resolution is defined by the spacing between the second magnetization layers (the differential system). However, it is considered that such reference examples have difficulty in the improvement in magnetic noise. In contrast, the embodiment can suppress magnetic noise.

Furthermore, a reference example using the phase detection of the oscillation frequency of an STO device may be possible as a reproducing device. This case requires a circuit for the phase detection. In contrast, the embodiment does not require the circuit, and can therefore reduce costs.

In the embodiment, as illustrated in FIG. 5A, for example, when the magnetic field in the film surface of the second magnetization layer 32 is as small as about 1 kOe, the resistance does not substantially change. Consequently, for example, the component in the direction perpendicular to the film surface of the second magnetization layer 32 (the X-axis direction component) of the magnetic field from the magnetic recording medium 80 is detected. Thereby, for example, reproduction for narrow bit lengths can be performed with high resolution also in the case where the shield is not provided.

Furthermore, the magnetization of the second magnetization layer 32 can make large uniform in-plane rotation by sufficiently strong spin torque transfer. Thereby, the random thermal fluctuation of the magnetization due to spin torque transfer energy can be suppressed. Thus, reproduced signals with a high S/N ratio are obtained.

Furthermore, in the embodiment, the resistance change is detected as a reproduced signal as in the case of the reproducing section of common magnetic heads. Therefore, no special detection circuit is necessary. Thus, the cost does not increase.

The embodiment can suppress thermal fluctuation noise and the magnetic noise resulting from spin transfer torque, which are issues in the information reproduction of future high recording density HDD. Thereby, a magnetoresistive effect magnetic head with suppressed noise can be provided. For example, a new magnetoresistive effect head with a low resistance, high MR ratio, high resolution, and low magnetic noise can be provided.

Thus, the magnetic head according to the embodiment includes the stacked film 71 including a spin injection layer (the first magnetization layer 31) in which the magnetization is directed almost to the perpendicular-to-plane direction and a magnetic field detection layer (the second magnetization layer 32) that makes spin torque oscillation due to electrons injected from the spin injection layer. The stacked film 71 is, for example, an STO. The magnetic field application unit 75 is further provided that applies the bias magnetic field Hb in the perpendicular-to-plane direction of the stacked film 71 (along the X-axis). A current I1 not less than the threshold (the threshold for the second magnetization layer 32 making spin torque oscillation) is passed through the stacked film 71 in the perpendicular-to-plane direction. In this state, the resistance of the stacked film 71 changes in accordance with the signal magnetic field of the magnetic recording medium 80 (the medium magnetic field). The change is detected and the reproducing operation is thus performed.

The method for applying the bias magnetic field Hb to the stacked film 71 is arbitrary.

In the magnetic head 110 illustrated in FIG. 1, the magnetic field application unit 75 includes the second magnetization fixed layer 22 that is stacked with the stacked film 71 and has a perpendicular magnetic anisotropy and in which the magnetization is fixed in the direction of the magnetization of the first magnetization layer 31 and the second nonmagnetic layer 21 provided between the stacked film 71 and the second magnetization fixed layer 22. The second magnetization layer 32 is placed between the first magnetization layer 31 and the second nonmagnetic layer 21.

That is, the second magnetization fixed layer 22 provided on the second magnetization layer 32 side of the stacked film 71 via the second nonmagnetic layer 21 is used as the magnetic field application unit 75. The second magnetization fixed layer 22 is a perpendicular magnetic film. The magnetization of the second magnetization fixed layer 22 is directed to the same direction as the magnetization of the spin injection layer.

Figure 8:
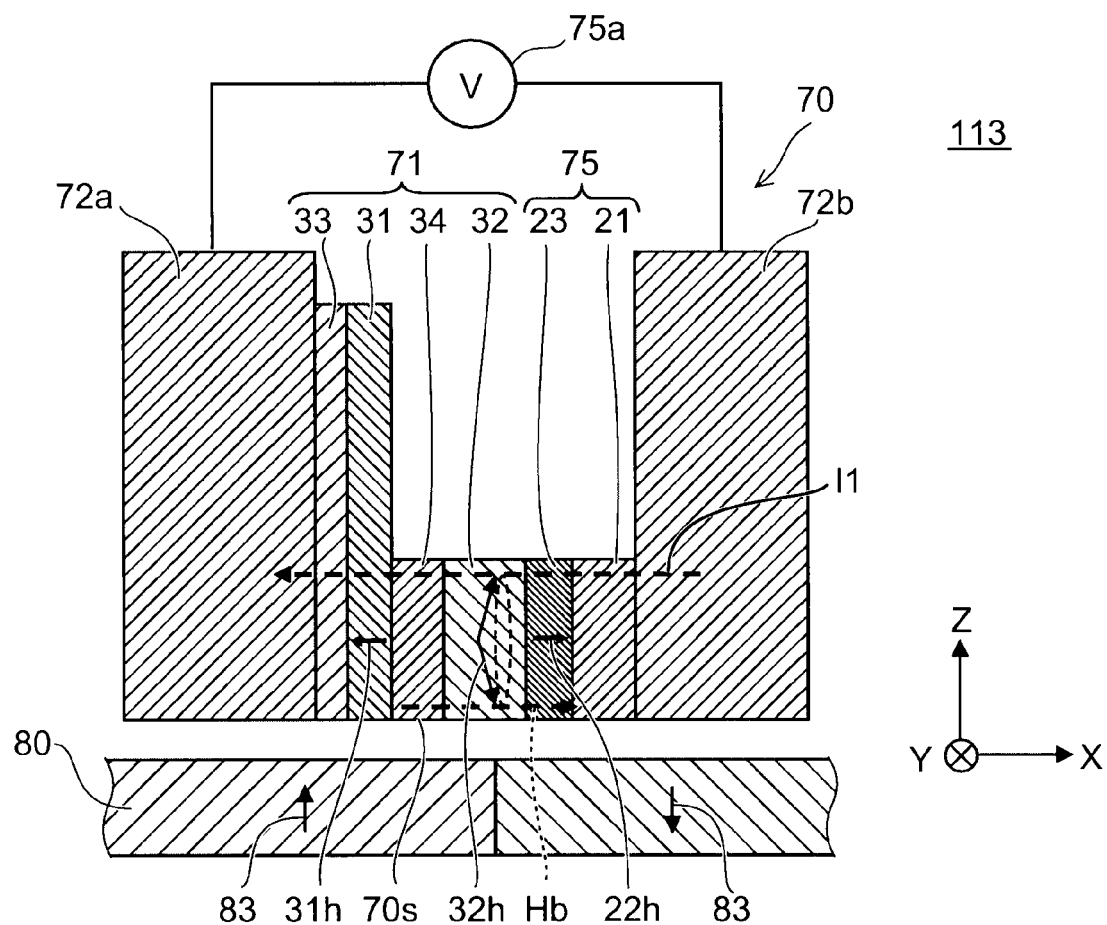
FIG. 8 is a schematic cross-sectional view illustrating the configuration of another magnetic head according to the first embodiment.

FIG. 8 is a schematic cross-sectional view illustrating the configuration of another magnetic head according to the first embodiment. As shown in FIG. 8, in a magnetic head 113 according to the embodiment, the magnetic field application unit 75 includes a third magnetization fixed layer 23. The third magnetization fixed layer 23 is in contact with the second magnetization layer 32 without a nonmagnetic layer therebetween so that a strong exchange coupling magnetic field may be applied. The magnetization of the third magnetization fixed layer 23 (a third magnetization fixed layer magnetization 23h) is fixed in the direction opposite to the direction of the magnetization of the first magnetization layer 31. The second magnetization layer 32 is placed between the first magnetization layer 31 and the third magnetization fixed layer 23.

For example, when the magnetization of the first magnetization layer 31 runs along the −X-axis direction, the magnetization of the third magnetization fixed layer 23 runs along the +X-axis direction. When the magnetization of the first magnetization layer 31 runs along the +X-axis direction, the magnetization of the third magnetization fixed layer 23 runs along the −X-axis direction.

The second magnetization layer 32 is coupled directly to the third magnetization fixed layer 23 by magnetic exchange coupling. Thereby, a strong bias magnetic field Hb is applied to the stacked film 71.

Thus, in the magnetic head 113, the third magnetization fixed layer 23 provided in contact with the second magnetization layer 32 on the second magnetization layer 32 side of the stacked film 71 is used as the magnetic field application unit 75. The third magnetization fixed layer 23 is a perpendicular magnetic film. The magnetization of the third magnetization fixed layer 23 is directed to the opposite direction to the magnetization of the spin injection layer.

Furthermore, the direction of the sense current (the current I1) passed is the opposite direction to FIG. 1. That is, the current I1 is passed in a direction from the second magnetization layer 32 to the first magnetization layer 31. Consequently, the magnetization of the second magnetization layer 32 rotates largely due to spin torque, and the resistance of the magnetoresistive effect film (the stacked film 71) changes due to the medium magnetic field.

A material having a perpendicular magnetic anisotropy similar to that of the first magnetization layer 31 may be used for the third magnetization fixed layer 23.

In this specific example, the magnetic field application unit 75 may further include the second nonmagnetic layer 21 (a cap layer). The third magnetization fixed layer 23 is provided between the second magnetization layer 32 and the second nonmagnetic layer 21 and in contact with the second magnetization layer 32.

Furthermore, as described later, an electromagnet may be used as the magnetic field application unit 75.

In the embodiment, a pair of shields (the first magnetic shield 72a and the second magnetic shield 72b) may be provided in order to improve the resolution. In this case, the shields preferably function as electrodes. Thereby, the resolution is further improved. In other words, the magnetic head according to the embodiment may further include the first magnetic shield 72a and the second magnetic shield 72b. The stacked film 71 and the magnetic field application unit 75 are disposed between the first magnetic shield 72a and the second magnetic shield 72b. The current I1 is passed via the first magnetic shield 72a and the second magnetic shield 72b.

Figure 9:
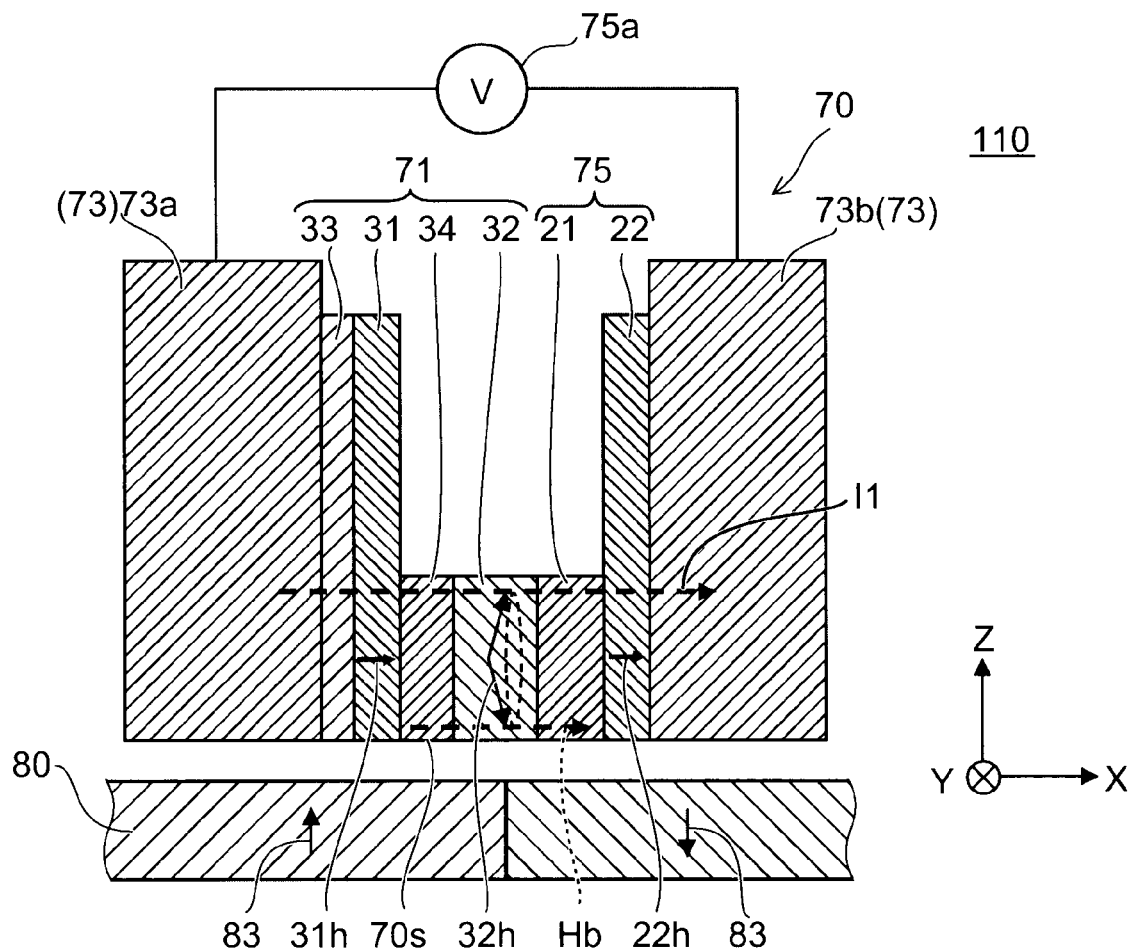
FIG. 9 is a schematic cross-sectional view illustrating the configuration of another magnetic head according to the first embodiment.

FIG. 9 is a schematic cross-sectional view illustrating the configuration of another magnetic head according to the first embodiment. As shown in FIG. 9, a magnetic head 114 according to the embodiment further includes an electrode 73 stacked with the stacked film 71 along the X-axis. The electrode 73 passes a current not less than the threshold for spin torque oscillation from the first magnetization layer 31 to the second magnetization layer 32. The electrode 73 may include, for example, a first electrode 73a and a second electrode 73b. The stacked film 71 is placed between the first electrode 73a and the second electrode 73b.

Also a configuration is possible in which the electrode 73 is provided and the first magnetic shield 72a and the second magnetic shield 72b are further provided.

Figure 10:
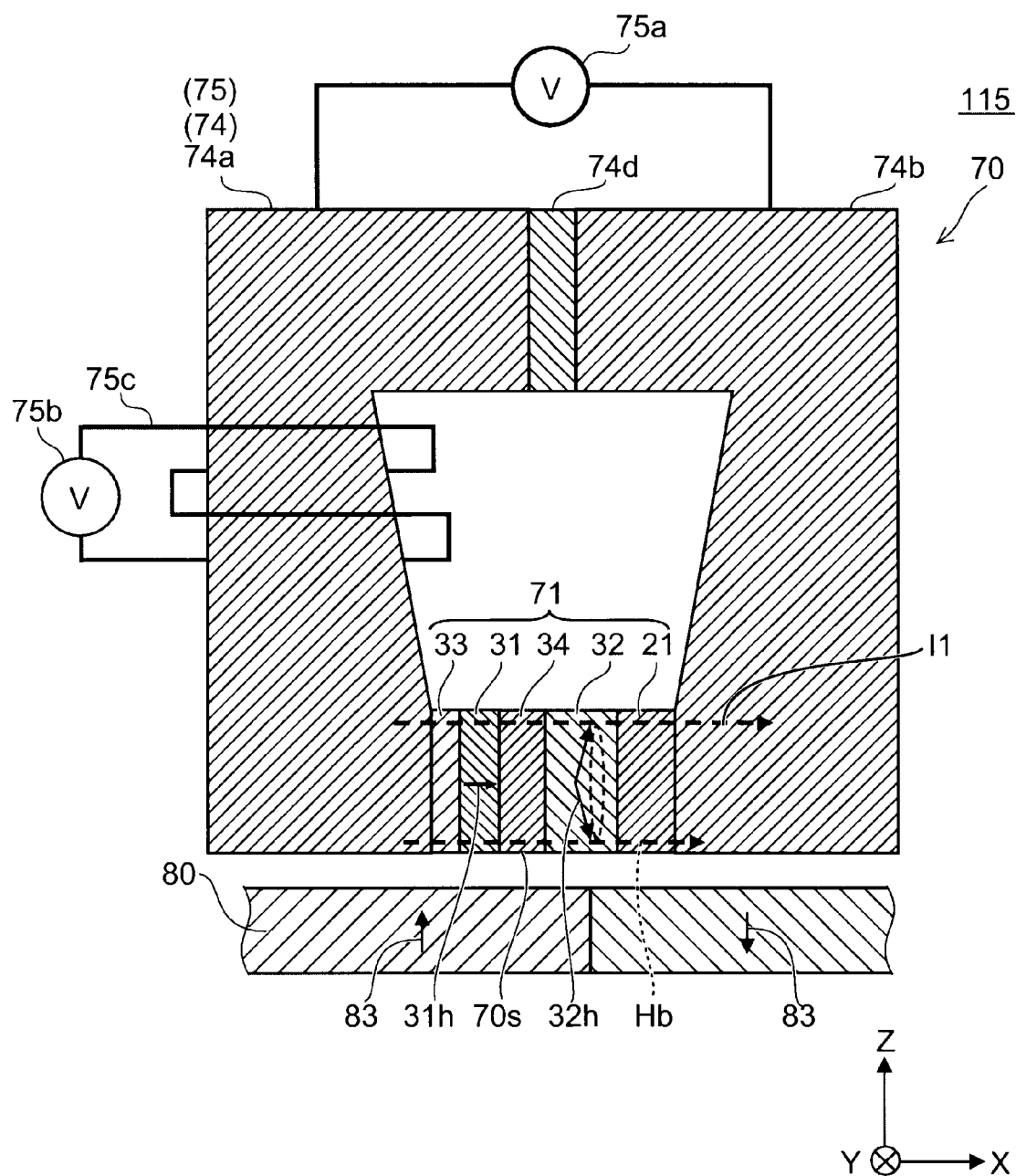
FIG. 10 is a schematic cross-sectional view illustrating the configuration of another magnetic head according to the first embodiment.

FIG. 10 is a schematic cross-sectional view illustrating the configuration of another magnetic head according to the first embodiment.

As shown in FIG. 10, in another magnetic head 115 according to the embodiment, an electromagnet unit 74 is used as the magnetic field application unit 75. The electromagnet unit 74 applies the bias magnetic field Hb to the stacked film 71.

The electromagnet unit 74 includes an electromagnet 74a juxtaposed to the stacked film 71. A coil 75c is wound around the electromagnet 74a. A second current supply unit 75b is connected to the coil 75c. The bias magnetic field Hb is applied to the stacked film 71 from the electromagnet 74a (the electromagnet unit 74) by the current supplied from the second current supply unit 75b. Thereby, the operations mentioned above are performed.

In this specific example, the electromagnet unit 74 further includes a reproducing section return path 74b opposed to the electromagnet 74a. In other words, the stacked film 71 is placed in a magnetic gap in which the electromagnet 74a is opposed to the reproducing section return path 74b. An electric resistance adjustment layer 74d may be provided between a portion of the electromagnet 74a on the opposite side to the medium facing surface 70s and a portion of the reproducing section return path 74b on the opposite side to the medium facing surface 70s. The electric resistance adjustment layer 74d shunts a current to suppress the deterioration caused by static electricity, for example.

In this specific example, the stacked film 71 further includes the second nonmagnetic layer 21 (e.g. a cap layer). The second nonmagnetic layer 21 is provided as necessary and may be omitted.

Second Embodiment

Figure 11:
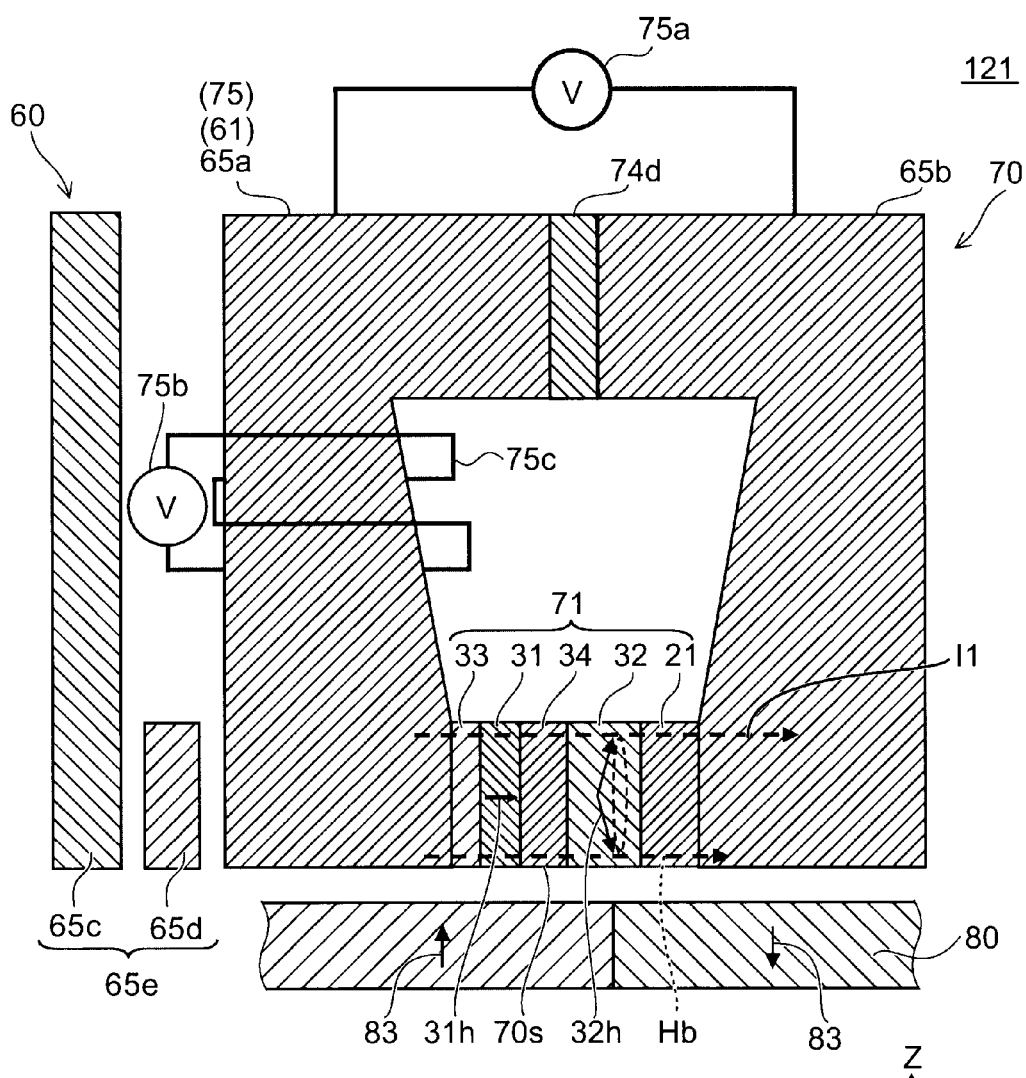
FIG. 11 is a schematic cross-sectional view illustrating the configuration of another magnetic head according to a second embodiment.

FIG. 11 is a schematic cross-sectional view illustrating the configuration of another magnetic head according to a second embodiment.

As shown in FIG. 11, a magnetic head 121 according to the embodiment includes an electromagnet 65a and the reproducing section 70.

The electromagnet 65a applies a recording magnetic field to the magnetic recording medium 80 in the writing operation in which information is recorded on the magnetic recording medium 80. The electromagnet 65a functions as the main magnetic pole 61. The electromagnet 65a is a portion of the writing section 60, for example.

The reproducing section 70 is juxtaposed to the electromagnet 65a. The reproducing section 70 detects the medium magnetic field (the magnetization 83) recorded in the magnetic recording medium 80.

Also in this case, the reproducing section 70 includes the stacked film 71. The stacked film 71 includes the first magnetization layer 31 having a perpendicular magnetic anisotropy in which the magnetization is fixed and the second magnetization layer 32 that is stacked with the first magnetization layer 31 along the first axis (the X-axis) and makes spin torque oscillation.

In the reproducing operation in which the medium magnetic field recorded in the magnetic recording medium 80 is detected, a bias magnetic field Hb having a component along the Z-axis is applied to the stacked film from the electromagnet 65a. When a current I1 not less than a value at which the second magnetization layer 32 makes spin torque oscillation is passed from the first magnetization layer 31 to the second magnetization layer 32, the resistance of the stacked film 71 changes in accordance with the medium magnetic field.

That is, in the writing operation, the electromagnet 65a functions as the main magnetic pole 61. In the reproducing operation, the electromagnet 65a functions as the magnetic field application unit 75. Thereby, the reproducing operation described in regard to the first embodiment is performed. The magnetic head 121 provides a magnetoresistive effect magnetic head with suppressed noise in reproducing.

In this specific example, the underlayer 33, the first magnetization layer 31, the intermediate layer 34, the second magnetization layer 32, and the second nonmagnetic layer 21 (a cap layer) sequentially stacked are provided in the stacked film 71.

A return path 65b opposed to the electromagnet 65a is further provided in the magnetic head 121. That is, the stacked film 71 is placed in a magnetic gap in which the electromagnet 65a is opposed to the return path 65b. Furthermore, the electric resistance adjustment layer 74d is provided between a portion of the electromagnet 65a and a portion of the return path 65b.

As shown in FIG. 11, the magnetic head 121 of this specific example further includes a heating unit 65e. The heating unit 65e is juxtaposed to the electromagnet 65a. The heating unit 65e heats the magnetic recording medium 80 locally in the writing operation. That is, the heat by the heating unit 65e assists the writing operation.

In this example, the heating unit 65e includes a waveguide layer 65c and a near-field light generation unit 65d. The waveguide layer 65c is juxtaposed to the electromagnet 65a. The waveguide layer 65c guides light. The light is, for example, a laser beam.

The near-field light generation unit 65d is provided between the electromagnet 65a and the waveguide layer 65c. In the writing operation, the near-field light generation unit 65d uses the light guided through the waveguide layer 65c to generate near-field light that heats the magnetic recording medium 80 locally.

In the magnetic head 121, the electromagnet 65a functioning as the main magnetic pole 61 of the writing section 60 is used as the magnetic field application unit 75 for the reproducing section 70. Thereby, the noise in reproducing is suppressed, and the configuration is simplified to allow downsizing as well.

In the magnetic heads according to the first and second embodiments, the resistance of the stacked film 71 changes in accordance with the medium magnetic field recorded in the magnetic recording medium 80. The change in the resistance is detected by a detection circuit connected to the magnetic head.

Third Embodiment

The magnetic heads according to the first and second embodiments described above may be incorporated in an integrated recording/reproducing magnetic head assembly, which may be installed in a magnetic recording/reproducing apparatus, for example. The magnetic recording/reproducing apparatus according to the embodiment can have only the reproducing function or both the recording function and the reproducing function.

Figure 12:
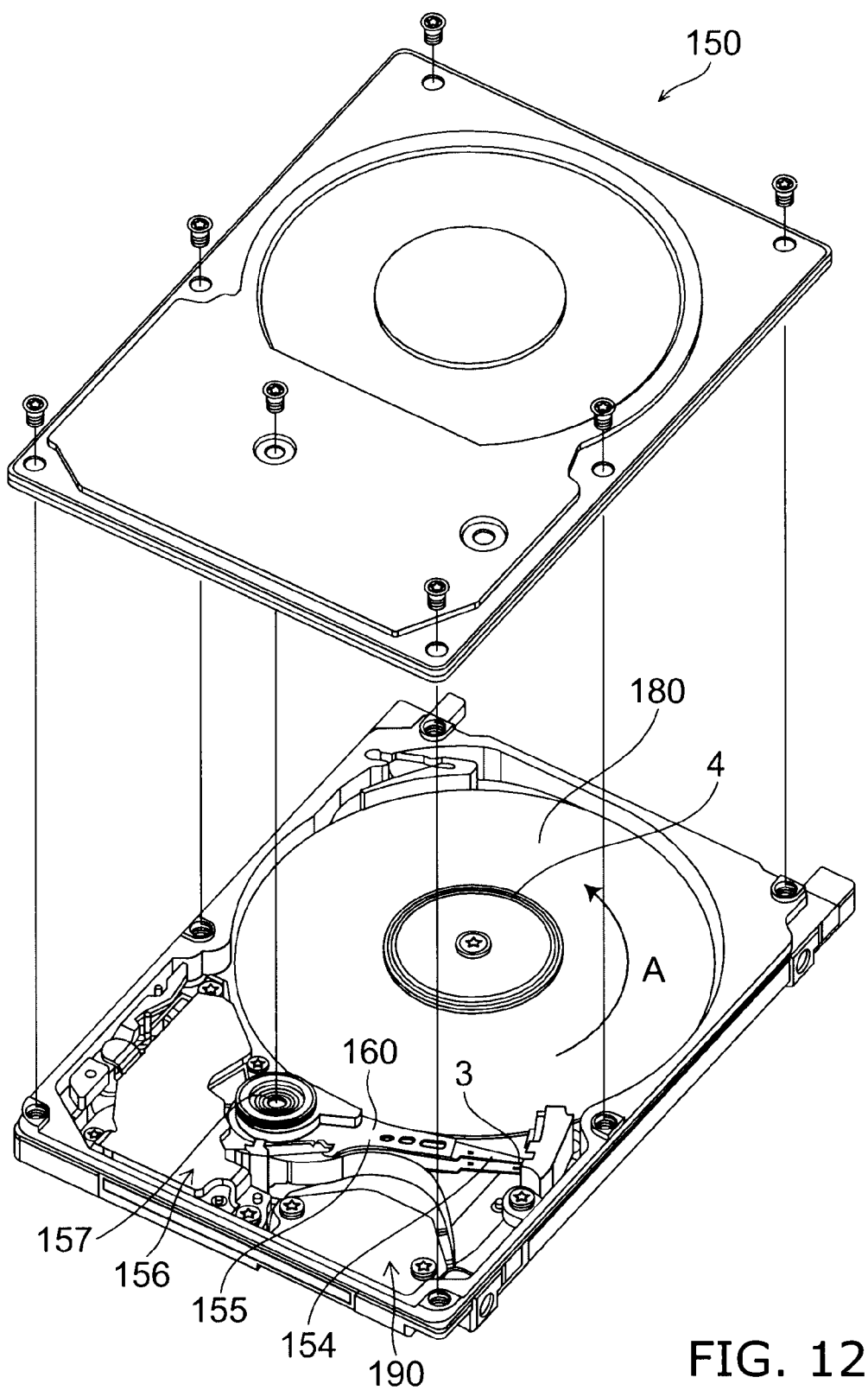
FIG. 12 is a schematic perspective view illustrating the configuration of a magnetic recording/reproducing apparatus according to a third embodiment.

FIG. 12 is a schematic perspective view illustrating the configuration of a magnetic recording/reproducing apparatus according to a third embodiment.

Figure 13A:
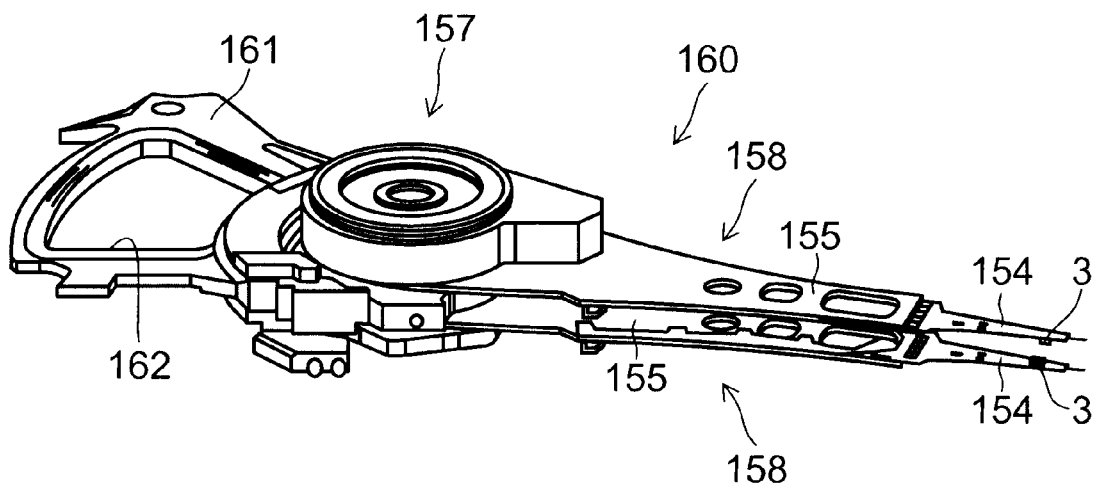
FIGS. 13A and 13B are schematic perspective views illustrating the configuration of part of a magnetic recording apparatus according to the third embodiment.
Figure 13B:
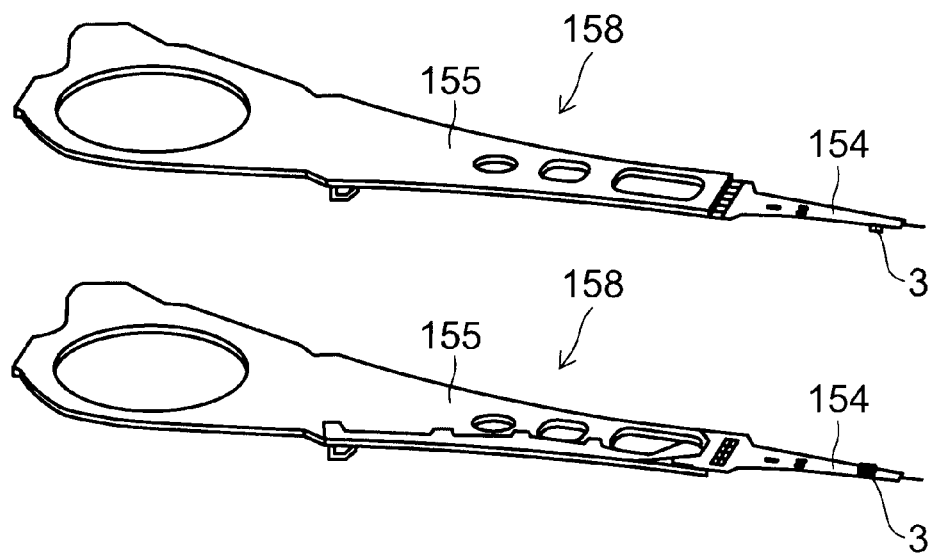

FIGS. 13A and 13B are schematic perspective views illustrating the configuration of part of a magnetic recording apparatus according to the third embodiment.

As shown in FIG. 12, a magnetic recording/reproducing apparatus 150 according to the embodiment is an apparatus using a rotary actuator. A recording medium disk 180 is mounted on a spindle motor 4. The recording medium disk 180 is rotated in the direction of arrow A by a not-shown motor. The motor responds to a control signal from a not-shown driving device control unit, for example. The magnetic recording/reproducing apparatus 150 according to the embodiment may include a plurality of recording medium disks 180.

The recording and reproducing of information stored in the recording medium disk 180 are performed by the head slider 3. The head slider 3 has the configuration illustrated above. The head slider 3 is provided at the tip of a suspension 154. The suspension 154 is in a thin film form. One of the magnetic heads according to the embodiments described above (e.g. the magnetic heads 110 to 114), for example, is mounted near the tip of the head slider 3.

When the recording medium disk 180 rotates, the head slider 3 is held above the surface of the recording medium disk 180. That is, the pressing pressure by the suspension 154 is balanced with the pressure generated at the medium facing surface (ABS) of the head slider 3. Thereby, the distance between the medium facing surface of the head slider 3 and the surface of the recording medium disk 180 is kept at a prescribed value. In the embodiment, also what is called a "contact-traveling type" may be used in which the head slider 3 is in contact with the recording medium disk 180.

The suspension 154 is connected to one end of an actuator arm 155. The actuator arm 155 includes, for example, a bobbin that holds a not-shown driving coil and the like. A voice coil motor 156 is provided at the other end of the actuator arm 155. The voice coil motor 156 is, for example, a kind of linear motor. The voice coil motor 156 may include, for example, a not-shown driving coil and a magnetic circuit. The driving coil is wound around the bobbin of the actuator arm 155, for example. The magnetic circuit may include, for example, a permanent magnet and an opposed yoke not shown. The permanent magnet and the opposed yoke are opposed to each other, and the driving coil is placed between them.

The actuator arm 155 is held by, for example, not-shown ball bearings. The ball bearings are provided at two positions, the top and bottom, of a bearing portion 157, for example. The actuator arm 155 can rotationally slide freely by means of the voice coil motor 156. Consequently, the magnetic head can move to an arbitrary position on the recording medium disk 180.

FIG. 13A illustrates the configuration of part of the magnetic recording/reproducing apparatus, and is an enlarged perspective view of a head stack assembly 160.

FIG. 13B is a perspective view illustrating a magnetic head assembly (head gimbal assembly, HGA) 158, which constitutes part of the head stack assembly 160.

As shown in FIG. 13A, the head stack assembly 160 includes the bearing portion 157, a head gimbal assembly 158, and a support frame 161. The head gimbal assembly 158 extends from the bearing portion 157. The support frame 161 extends from the bearing portion 157 in the opposite direction to the HGA. The support frame 161 supports the coil 162 of the voice coil motor As shown in FIG. 13B, the head gimbal assembly 158 includes the actuator arm 155 and the suspension 154. The actuator arm 155 extends from the bearing portion 157. The suspension 154 extends from the actuator arm 155.

The head slider 3 is provided at the tip of the suspension 154. One of the magnetic heads according to the embodiments is installed on the head slider 3.

That is, the magnetic head assembly (head gimbal assembly) 158 according to the embodiment includes the magnetic head according to the embodiment, the head slider 3 with the magnetic head installed thereon, the suspension 154, and the actuator arm 155. The head slider 3 is installed on one end of the suspension 154. The actuator arm 155 is connected to the other end of the suspension 154.

The suspension 154 includes lead wires (not shown) for writing and reading signals, for a heater for adjusting the floating amount, and/or for other uses. The lead wires are electrically connected to the respective electrodes of the magnetic head incorporated in the head slider 3.

Furthermore, a signal processing unit 190 is provided that uses the magnetic head to perform the writing and reading of signals on the magnetic recording medium.

The signal processing unit 190 is provided on the back side, in FIG. 12, of the magnetic recording/reproducing apparatus 150 illustrated in FIG. 12, for example. The input/output lines of the signal processing unit 190 are connected to the electrode pads of the head gimbal assembly 158 to be electrically connected to the magnetic head.

That is, the signal processing unit 190 is electrically connected to the magnetic head.

The change in the resistance of the stacked film 71 of the magnetic head in accordance with the medium magnetic field recorded in the magnetic recording medium 80 is detected by, for example, the signal processing unit 190.

Thus, the magnetic recording/reproducing apparatus 150 according to the embodiment includes the magnetic recording medium, the magnetic head according to the embodiments mentioned above, a movable unit capable of relatively moving the magnetic recording medium and the magnetic head in a state where the magnetic recording medium and the magnetic head are away from or in contact with each other, a position control unit that positions the magnetic head at a prescribed recording position on the magnetic recording medium, and the signal processing unit that uses the magnetic head to perform the writing and reading of signals on the magnetic recording medium.

That is, the recording medium disk 180 is used as the magnetic recording medium 80 mentioned above. The movable unit mentioned above may include the head slider 3.

The position control unit mentioned above may include the head gimbal assembly 158.

Thus, the magnetic recording/reproducing apparatus 150 according to the embodiment includes the magnetic recording medium, the magnetic head assembly according to the embodiment, and the signal processing unit 190 that uses the magnetic head installed on the magnetic head assembly to perform the writing and reading of signals on the magnetic recording medium.

The magnetic recording/reproducing apparatus 150 according to the embodiment uses the magnetic head according to the embodiments mentioned above, and can thereby perform reproduction with suppressed noise. Furthermore, reproduction with low resistance, high MR ratio, and high resolution can be performed.

In the magnetic recording/reproducing apparatus 150 according to the embodiment, the recording track width of the recording medium disk 180 (the magnetic recording medium 80) is preferably not more than 30 nm. Thereby, particularly the effect of suppressing spin transfer torque is exhibited. That is, in the case where the recording track width is not more than 30 nm, the width of the second magnetization layer 32 is set not more than 30 nm. The effect of suppressing spin transfer torque is more clearly exhibited under this condition.

Fourth Embodiment

Figure 14:
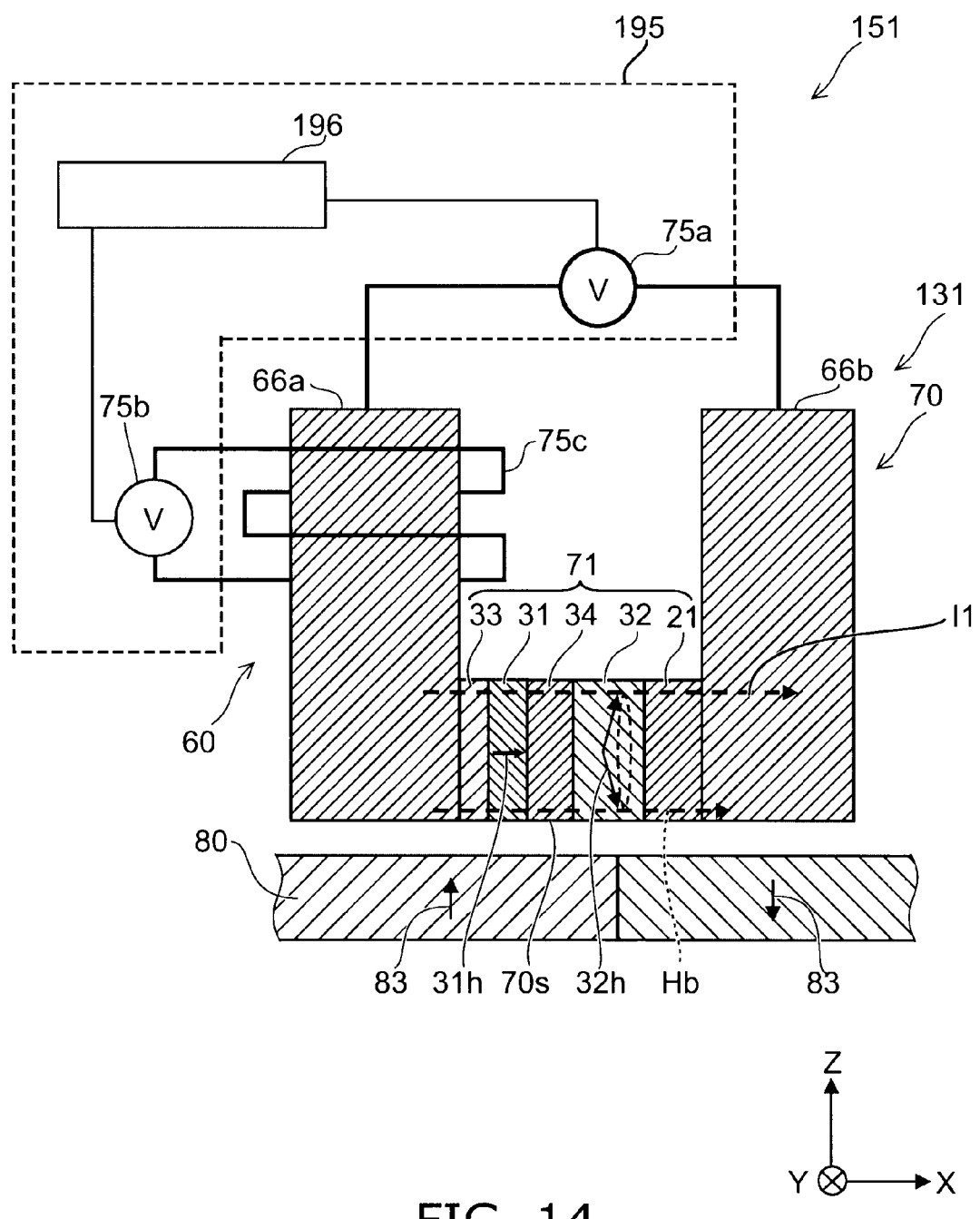
FIG. 14 is a schematic view illustrating the configuration of a magnetic recording/reproducing apparatus according to a fourth embodiment.

FIG. 14 is a schematic view illustrating the configuration of a magnetic recording/reproducing apparatus according to a fourth embodiment.

More specifically, FIG. 14 schematically illustrates a cross section of a main part of a magnetic head included in a magnetic recording/reproducing apparatus and schematically illustrates a control unit.

As shown in FIG. 14, a magnetic recording/reproducing apparatus 151 according to the embodiment includes the magnetic recording medium 80, a magnetic head 131, and a control unit 195. In the magnetic recording/reproducing apparatus 151, the configuration of the head slider 3 on which the magnetic head 131 is installed, the head gimbal assembly 158, the head stack assembly 160, and the like may be similar to those described above and a description is therefore omitted. The configuration of the whole magnetic recording/reproducing apparatus 151 is similar to that of the magnetic recording/reproducing apparatus 150 described in regard to FIG. 12.

In the magnetic recording/reproducing apparatus 151, for example, the recording medium disk 180 may be used as the magnetic recording medium 80.

The control unit 195 in the magnetic recording/reproducing apparatus 151 may have a similar configuration to the signal processing unit 190 in the magnetic recording/reproducing apparatus 150.

As shown in FIG. 14, the magnetic head 131 includes an electromagnet 66a and the stacked film 71. The electromagnet 66a is opposed to the magnetic recording medium 80.

The stacked film 71 is juxtaposed to the electromagnet 66a. The stacked film 71 includes the first magnetization layer and the second magnetization layer 32. The first magnetization layer 31 has a perpendicular magnetic anisotropy, and the magnetization of thereof is fixed. The second magnetization layer 32 is stacked with the first magnetization layer 31 along the first axis (the X-axis). The second magnetization layer 32 makes spin torque oscillation.

The electromagnet 66a (and the stacked film 71) includes the medium facing surface 70s opposed to the magnetic recording medium 80.

The coil 75c is wound around the electromagnet 66a. The second current supply unit 75b is connected to the coil 75c.

A magnetic field is generated from the electromagnet 66a by the current supplied from the second current supply unit 75b.

In this specific example, an opposing portion 66b opposed to the electromagnet 66a is further provided. The stacked film 71 is placed in a gap in which the electromagnet 66a is opposed to the opposing portion 66b.

The electromagnet 66a and the opposing portion 66b can function as electrodes that pass the current I1 through the stacked film 71. However, the embodiment is not limited thereto, but an electrode may be provided apart from the electromagnet 66a, for example.

The first current supply unit 75a is connected to the electromagnet 66a and the opposing portion 66b. Thereby, a current is supplied from the first current supply unit 75a to the first magnetization layer 31 and the second magnetization layer 32.

In this specific example, the underlayer 33, the first magnetization layer 31, the intermediate layer 34, the second magnetization layer 32, and the second nonmagnetic layer 21 (a cap layer) sequentially staked are provided in the stacked film 71.

The control unit 195 is connected to the magnetic head 131. The control unit 195 includes, for example, a control signal unit 196, the first current supply unit 75a, and the second current supply unit 75b. The control unit 195 is provided on the back side in FIG. 12, for example. The input/output lines of the control unit 195 are connected to the electrode pads of the head gimbal assembly 158 to be electrically connected to the magnetic head 131.

The control signal unit 196 controls the operation of the first current supply unit 75a and the operation of the second current supply unit 75b. The control signal unit 196 supplies signals that control the operation of the first current supply unit 75a and the operation of the second current supply unit 75b to the first current supply unit 75a and the second current supply unit 75b, for example. The control signal unit 196 includes at least one of an analog circuit and a digital circuit. Control based on a computer program, for example, is used for the control of the first current supply unit 75a and the second current supply unit 75b by the control signal unit 196.

The following is performed in the writing operation in which information is recorded on the magnetic recording medium 80.

The control unit 195 makes the electromagnet 66a apply a recording magnetic field to the magnetic recording medium 80. Furthermore, the control unit 195 passes a current from the first magnetization layer 31 to the second magnetization layer 32, and thus causes the second magnetization layer 32 to make spin torque oscillation to generate a high-frequency magnetic field. The high-frequency magnetic field is applied to the magnetic recording medium 80 to which the recording magnetic field has been applied. Thereby, high-frequency assist recording using the high-frequency magnetic field caused by spin torque oscillation is performed.

Furthermore, the following is performed in the reproducing operation in which the medium magnetic field recorded in the magnetic recording medium 80 is detected.

The control unit 195 makes the electromagnet 66a apply a bias magnetic field Hb having a component along the first axis (the X-axis) to the stacked film 71. The bias magnetic field Hb at this time is a magnetic field having an absolute value smaller than that of the recording magnetic field in the writing operation. Furthermore, the control unit 195 passes a current from the first magnetization layer 31 to the second magnetization layer 32, and thus causes the second magnetization layer 32 to make spin torque oscillation with a frequency lower than that of the high-frequency magnetic field in the writing operation. That is, the control unit 195 passes the current I1 from the first magnetization layer 31 to the second magnetization layer 32. The value of the current I1 at this time is a current value not less than the threshold value for the second magnetization layer 32 making spin torque oscillation. Thereby, the second magnetization layer 32 is caused to make spin torque oscillation. The frequency of the spin torque oscillation of the second magnetization layer 32 is lower than the frequency of the high-frequency magnetic field in the writing operation. In the reproducing operation, the resistance of the stacked film 71 changes in accordance with the medium magnetic field. By detecting the change, the information recorded in the magnetic recording medium 80 can be reproduced. The detection is performed by, for example, the control unit 195 (the signal processing unit 190).

Thus, the electromagnet 66a of the magnetic head 131 according to the embodiment is used in both the writing operation and the reproducing operation. That is, the magnetic head 131 is an integrated recording/reproducing magnetic head. In the writing operation, high-frequency assist recording using the spin torque oscillation in the stacked film 71 is performed in the magnetic head 131. In the reproducing operation, the resistance change in the stacked film 71 that makes spin torque oscillation is used in the magnetic head 131.

The magnetic recording/reproducing apparatus 151 according to the embodiment utilizes the characteristics based on the uniform spin torque oscillation in the stacked film 71, similarly to the cases described in regard to the first embodiment. Thereby, for example, the noise resulting from thermal fluctuation can be reduced. Thus, a magnetic recording/reproducing apparatus with suppressed noise is obtained Furthermore, the magnetic recording/reproducing apparatus 151 also has a high resolution, similarly to the cases described in regard to the first embodiment. In addition, the configuration can be simplified and the thickness of the magnetic head (the thicknesses of the reproducing section 70 and the writing section 60) can be thinned. Moreover, the reproducing shield can be omitted.

A reference example may be possible in which an MR sensor (e.g. an AMR sensor, a GMR sensor, etc.) of a horizontal magnetic film is placed in the recording gap of the magnetic head. However, in the configuration of the reference example, the stray magnetic field in the recording gap makes a disturbance. Consequently, when the medium magnetic field is detected, the noise is large and the operation is unstable. For example, in the configuration of the reference example, applying a gap magnetic field of several kilooersteds leads to unstable reproducing operation.

In contrast, in the embodiment, the stacked film 71 including a perpendicular magnetic film is placed in the recording gap. The spin torque oscillation in the perpendicular magnetic film-based configuration is used. By utilizing the recording gap magnetic field in a state where the spin torque oscillation is taking place, stable operation can be performed.

Figure 15:
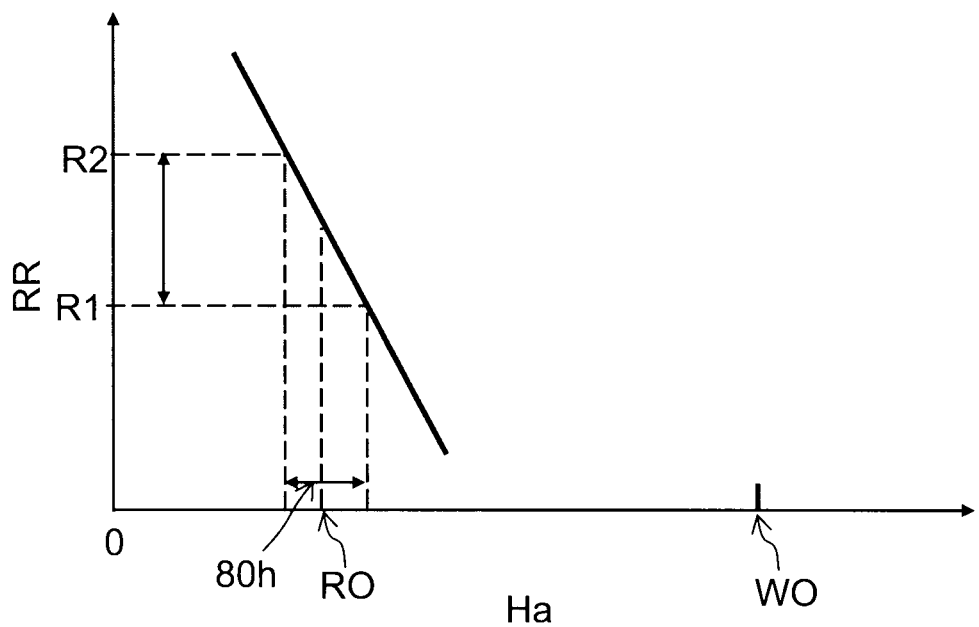
FIG. 15 is a graph illustrating the operation of the magnetic recording/reproducing apparatus according to the fourth embodiment.

FIG. 15 is a graph illustrating the operation of the magnetic recording/reproducing apparatus according to the fourth embodiment. The horizontal axis of FIG. 15 represents the magnetic field Ha applied to the stacked film 71 (STO). The magnetic field Ha is a perpendicular magnetic field. The magnitude of the magnetic field Ha corresponds to, for example, the magnitude of the coil current flowing through the coil 75c around the electromagnet 66a. The magnitude of the magnetic field Ha is linked to, for example, the magnitude of the recording magnetic field applied to the magnetic recording medium 80. The vertical axis of FIG. 15 represents the resistance RR of the stacked film 71.

As shown in FIG. 15, in the writing operation WO, the magnetic field Ha is relatively large. The magnitude of the magnetic field Ha in the writing operation WO is, for example, about 10 kOe.

On the other hand, in the reproducing operation RO, the magnitude of the magnetic field Ha applied to the stacked film 71 is smaller than that of the magnetic field Ha in the writing operation WO. In this state, the medium magnetic field 80h of the magnetic recording medium 80 is applied to the stacked film 71. The resistance RR of the stacked film 71 changes in accordance with the medium magnetic field 80h. In this example, the resistance RR changes between a first resistance R1 and a second resistance R2. As described above, the change in the resistance RR is substantially linear with respect to the medium magnetic field 80h.

Figure 16:
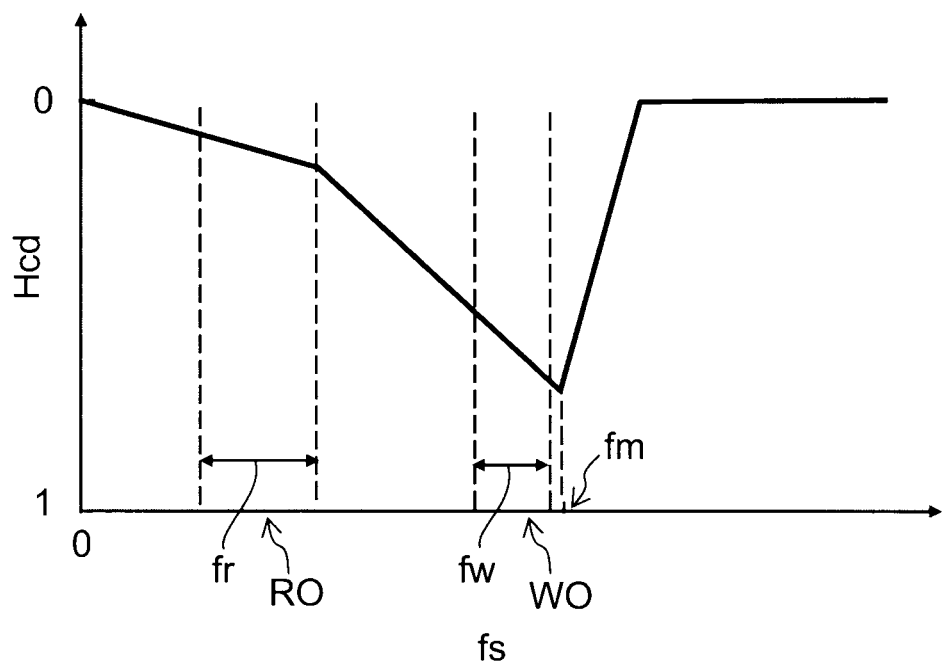
FIG. 16 is a graph illustrating the operation of the magnetic recording/reproducing apparatus according to the fourth embodiment.

FIG. 16 is a graph illustrating the operation of the magnetic recording/reproducing apparatus according to the fourth embodiment. The horizontal axis of the drawing represents the frequency fs of the spin torque oscillation in the STO (specifically, the second magnetization layer 32). The vertical axis represents the medium coercive force reduction effect Hcd that expresses the degree to which the coercive force of the magnetic recording medium 80 is reduced due to the high frequency applied.

As shown in FIG. 16, the frequency fs of the spin torque oscillation in the writing operation WO is set to a value near the medium eigenfrequency fm (a frequency range for writing fw). The frequency fs of the spin torque oscillation in the reproducing operation RO is set to a value significantly lower than the medium eigenfrequency fm (a frequency range for reproducing fr). Thus, in the magnetic recording/reproducing apparatus 151, the frequency fs of the spin torque oscillation of the second magnetization layer 32 in the reproducing operation RO is lower than the frequency of the high-frequency magnetic field in the writing operation WO. Thereby, the disorder of the medium magnetic field recorded in the magnetic recording medium 80 is suppressed in the reproducing operation RO.

The frequency fs of the spin torque oscillation of the second magnetization layer 32 in the reproducing operation RO is, for example, lower than the ferromagnetic resonance frequency of the magnetic recording medium 80 (the medium eigenfrequency fm).

In the magnetic recording/reproducing apparatus 151 according to the embodiment, the second magnetization layer may include the first magnetic layer 32a, the second magnetic layer 32b stacked with the first magnetic layer 32a along the first axis (the X-axis) and having a magnetization in the direction opposite to the direction of the magnetization of the first magnetic layer 32a, and the first nonmagnetic layer 32c provided between the first magnetic layer 32a and the second magnetic layer 32b. Thereby, the possibility can be reduced that the recording state of the magnetization 83 of the magnetic recording medium 80 will become unstable.

In the magnetic recording/reproducing apparatus 151, the magnetic thickness of the second magnetization layer 32 is preferably set less than 5 nmT. Thereby, the recording state of the magnetization 83 of the magnetic recording medium 80 is stabilized.

In the magnetic recording/reproducing apparatus 151, the width of the first magnetization layer 31 along an axis perpendicular to the first axis is preferably larger than the width of the second magnetization layer 32 along the axis perpendicular to the first axis. Thereby, the disorder of the magnetization due to the reaction spin torque from the second magnetization layer 32 can be suppressed. Furthermore, the patterning of the second magnetization layer 32 becomes easy. The resistance of the reproducing section 70 can be reduced.

The embodiment can provide a magnetoresistive effect magnetic head, a magnetic head assembly, and a magnetic recording/reproducing apparatus with suppressed noise.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may appropriately select specific configurations of components of magnetic heads such as reproducing sections, stacked films, first magnetization layer, second magnetization layer, magnetic layers, nonmagnetic layers, and writing sections, components of magnetic head assemblies such as head sliders, suspensions, and actuator arms, and components of magnetic recording/reproducing apparatuses such as magnetic recording media from known art and similarly practice the invention. Such practice is included in the scope of the invention to the extent that similar effects thereto are obtained. For example, the materials, compositions, film thicknesses, and the like described in the embodiments mentioned above are only examples and various selections are possible.

Further, any two or more components of the specific examples may be combined within the extent of technical feasibility and are included in the scope of the embodiments to the extent that the spirit of the embodiments is included.

Moreover, all magnetic heads, magnetic head assemblies, and magnetic recording/reproducing apparatuses practicable by an appropriate design modification by one skilled in the art based on the magnetic heads, the magnetic head assemblies, and the magnetic recording/reproducing apparatuses described above as embodiments of the invention also are within the scope of the invention to the extent that the spirit of the invention is included.

Furthermore, various modifications and alterations within the spirit of the invention will be readily apparent to those skilled in the art. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic head comprising a reproducing section configured to detect a medium magnetic field recorded in a magnetic recording medium,
    the reproducing section including:
        a stacked film including:
            a first magnetization layer having a perpendicular magnetic anisotropy, a magnetization of the first magnetization layer being fixed; and
            a second magnetization layer stacked with the first magnetization layer along a first axis and configured to oscillate, the second magnetization layer having a perpendicular magnetic anisotropy; and
        a magnetic field application unit stacked with the stacked film along the first axis and configured to apply a bias magnetic field having a component along the first axis to the stacked film,
    a resistance of the stacked film being configured to change in accordance with the medium magnetic field when a current not less than a value at which the second magnetization layer oscillates is passed between the first magnetization layer and the second magnetization layer.

2. The head according to claim 1, wherein
the second magnetization layer includes:
    a first magnetic layer;
    a second magnetic layer stacked with the first magnetic layer along the first axis and having a magnetization in a direction opposite to a direction of a magnetization of the first magnetic layer; and
    a first nonmagnetic layer provided between the first magnetic layer and the second magnetic layer, and
the current is passed in a direction from the second magnetization layer to the first magnetization layer.

3. The head according to claim 1, wherein a magnetic thickness of the second magnetization layer is less than five nanometer·tesla.

4. The head according claim 1, wherein a width of the first magnetization layer along an axis perpendicular to the first axis is larger than a width of the second magnetization layer along the axis perpendicular to the first axis.

5. The head according to claim 1, wherein
the magnetic field application unit includes:
    a second magnetization fixed layer stacked with the stacked film and having a perpendicular magnetic anisotropy, a magnetization of the second magnetization fixed layer being fixed in a direction of the magnetization of the first magnetization layer; and
    a second nonmagnetic layer provided between the stacked film and the second magnetization fixed layer,
the second magnetization layer is placed between the first magnetization layer and the second nonmagnetic layer.

6. The head according to claim 1, wherein
the magnetic field application unit includes a third magnetization fixed layer in contact with the second magnetization layer, a magnetization of the third magnetization fixed layer being fixed in a direction opposite to a direction of the magnetization of the first magnetization layer,
the second magnetization layer is placed between the first magnetization layer and the third magnetization fixed layer, and
the current is passed in a direction from the second magnetization layer to the first magnetization layer.

7. The head according to claim 1, wherein the magnetic field application unit further includes an electromagnet unit configured to apply the bias magnetic field to the stacked film.

8. A magnetic head assembly comprising:
    a magnetic head; and
    a suspension, the magnetic head being installed on one end of the suspension;
    the magnetic head including a reproducing section configured to detect a medium magnetic field recorded in a magnetic recording medium,
    the reproducing section including:
        a stacked film including:
            a first magnetization layer having a perpendicular magnetic anisotropy, a magnetization of the first magnetization layer being fixed; and
            a second magnetization layer stacked with the first magnetization layer along a first axis and configured to oscillate, the second magnetization layer having a perpendicular magnetic anisotropy; and
        a magnetic field application unit stacked with the stacked film along the first axis and configured to apply a bias magnetic field having a component along the first axis to the stacked film,
    a resistance of the stacked film being configured to change in accordance with the medium magnetic field when a current not less than a value at which the second magnetization layer oscillates is passed between the first magnetization layer and the second magnetization layer.

9. A magnetic recording/reproducing apparatus comprising:
    a magnetic head assembly including:
        a magnetic head;
        a suspension, the magnetic head being installed on one end of the suspension; and
        an actuator arm connected to another end of the suspension; and
    a magnetic recording medium, information in the magnetic recording medium being reproduced using the magnetic head installed on the magnetic head assembly,
    the magnetic head including a reproducing section configured to detect a medium magnetic field recorded in the magnetic recording medium,
    the reproducing section including:
        a stacked film including:
            a first magnetization layer having a perpendicular magnetic anisotropy, a magnetization of the first magnetization layer being fixed; and
            a second magnetization layer stacked with the first magnetization layer along a first axis and configured to oscillate, the second magnetization layer having a perpendicular magnetic anisotropy; and a magnetic field application unit stacked with the stacked film along the first axis and configured to apply a bias magnetic field having a component along the first axis to the stacked film, a resistance of the stacked film being configured to change in accordance with the medium magnetic field when a current not less than a value at which the second magnetization layer oscillates is passed between the first magnetization layer and the second magnetization layer.

10. The apparatus according to claim 9, wherein a frequency of a spin torque oscillation of the second magnetization layer is higher than a ferromagnetic resonance frequency of the magnetic recording medium.

* * * * *